US009018096B2

(12) United States Patent
Price et al.

(10) Patent No.: US 9,018,096 B2
(45) Date of Patent: Apr. 28, 2015

(54) STRUCTURES COMPRISING PLANAR ELECTRONIC DEVICES

(75) Inventors: Richard David Price, Manchester (GB); Ian Barton, Hartford (GB)

(73) Assignee: Pragmatic Printing Ltd., Manchester (GB)

( * ) Notice: Subject to any disclaimer, the term of this patent is extended or adjusted under 35 U.S.C. 154(b) by 65 days.

(21) Appl. No.: 13/393,811

(22) PCT Filed: Sep. 2, 2010

(86) PCT No.: PCT/GB2010/051451
§ 371 (c)(1),
(2), (4) Date: Mar. 1, 2012

(87) PCT Pub. No.: WO2011/027159
PCT Pub. Date: Mar. 10, 2011

(65) Prior Publication Data
US 2012/0153502 A1 Jun. 21, 2012

(30) Foreign Application Priority Data
Sep. 2, 2009 (GB) .................................. 0915250.5

(51) Int. Cl.
*H01L 23/48* (2006.01)
*H01L 21/768* (2006.01)
(52) U.S. Cl.
CPC ...... *H01L 21/76817* (2013.01); *H01L 21/7688* (2013.01)
(58) Field of Classification Search
USPC ............. 257/774, E23.011, E21.58, E21.586; 438/675
See application file for complete search history.

(56) References Cited

U.S. PATENT DOCUMENTS

| 5,926,735 | A | * | 7/1999 | Yamazaki et al. ............ 438/635 |
| 6,410,422 | B1 | | 6/2002 | Sun et al. |
| 2004/0175883 | A1 | | 9/2004 | Kim |
| 2005/0176239 | A1 | | 8/2005 | Kronke et al. |
| 2005/0202350 | A1 | | 9/2005 | Colburn et al. |
| 2008/0003818 | A1 | | 1/2008 | Seidel et al. |

FOREIGN PATENT DOCUMENTS

| WO | WO02/086973 A | 10/2002 |
| WO | WO 02/089199 | 11/2002 |
| WO | WO 2006/120414 | 11/2006 |

OTHER PUBLICATIONS

International Search Report and Written Opinion issued in PCT/GB2010/051451, mailed Jan. 3, 2011.
International Preliminary Report on Patentability, issued in PCT/GB2010/051451, dated Mar. 22, 2012, 19 pages.
United Kingdom Search Report, for corresponding Great Britain Application No. GB0915250.5, Jan. 25, 2010, 1 page.

* cited by examiner

*Primary Examiner* — Roy Potter
(74) *Attorney, Agent, or Firm* — Klarquist Sparkman, LLP

(57) ABSTRACT

A method of manufacturing a structure comprising substantially planar electronic devices comprises providing an active material layer having a plurality of insulative features formed therein. The features at least partly inhibit electrical current flow and define at least a first substantially planar electronic device in the layer having at least first and second terminals comprising an area of the active material layer. A patterned dielectric layer having an exposed surface patterned with at least a first depression arranged over the first terminal is formed over the active material layer. Dielectric material is removed from at least a base of the first depression to expose a first terminal surface and form a hole through the dielectric material to the first terminal. The hole is at least partly filled with electrically conductive material to form an electrical connection to the first terminal. Corresponding structures and electrical circuits are also described and claimed.

33 Claims, 16 Drawing Sheets

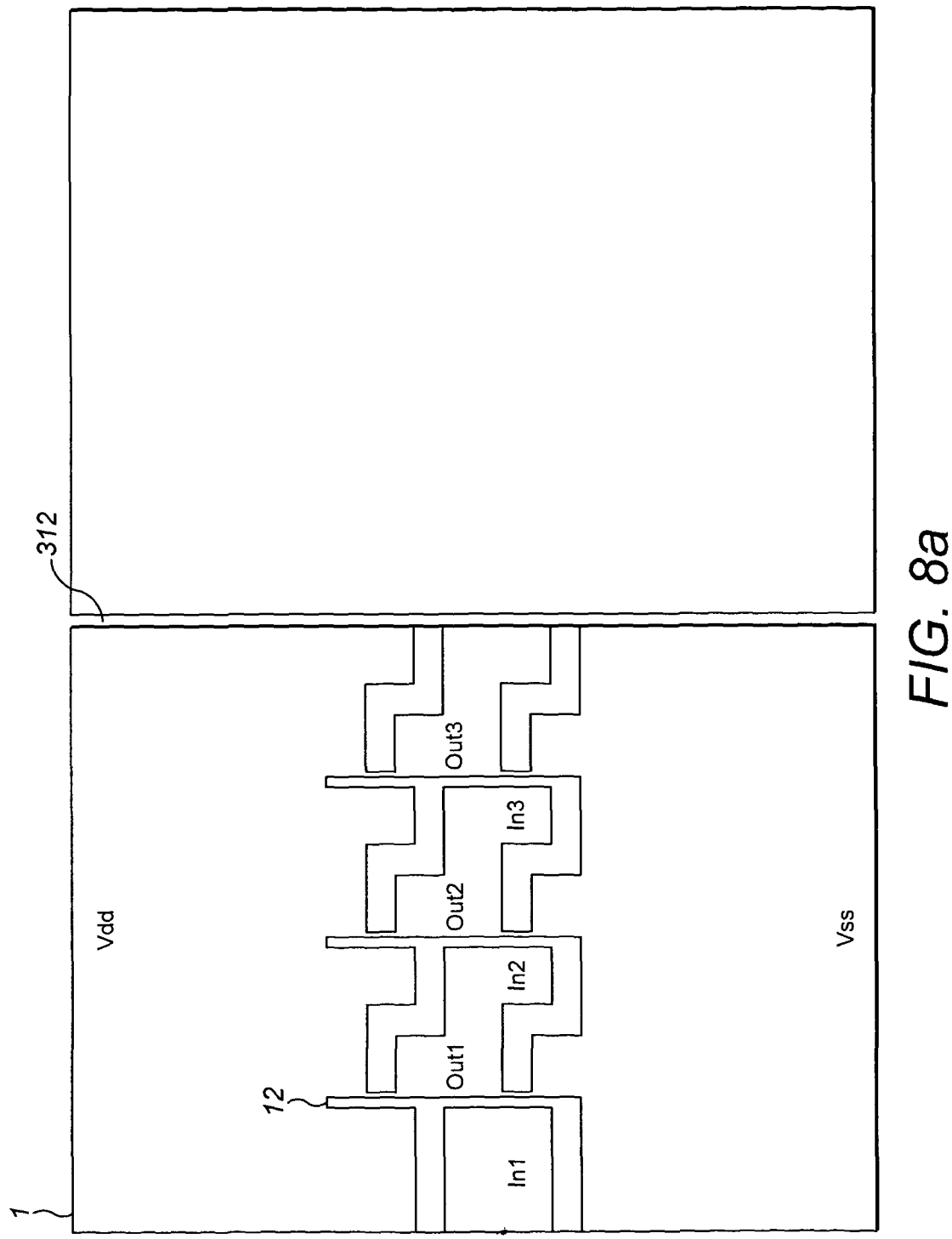

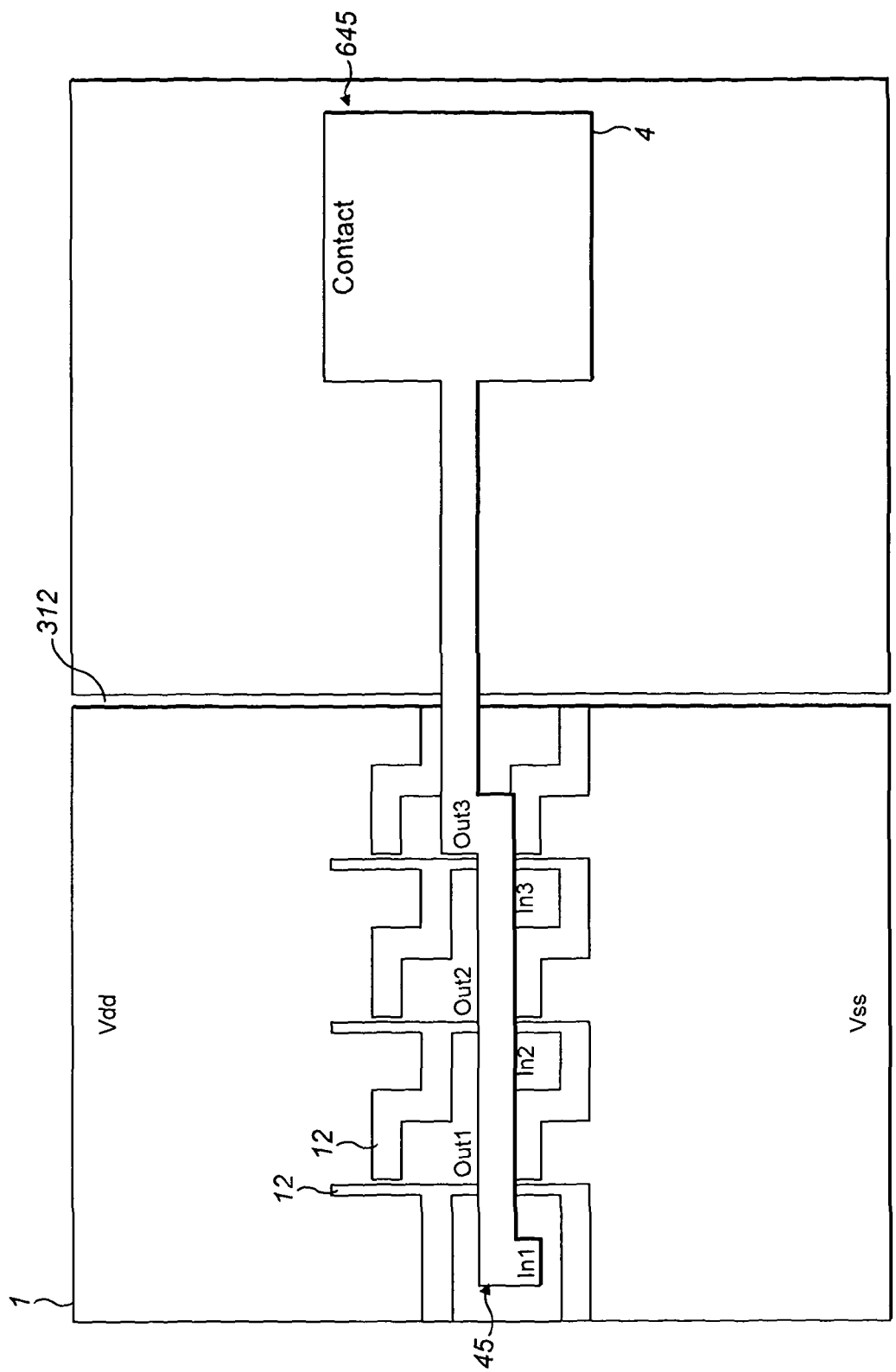

STRUCTURES COMPRISING PLANAR ELECTRONIC DEVICES

CROSS REFERENCE TO RELATED APPLICATIONS

This is the U.S. National Stage of International Application No. PCT/GB2010/051451, filed Sep. 2, 2010, which in turn claims the benefit of Great Britain Application No. 0915250.5, filed Sep. 2, 2009. Both applications are incorporated herein in their entirety.

FIELD OF THE INVENTION

The present invention relates to structures comprising at least one substantially planar electronic device, and to methods of manufacturing such structures. Certain embodiments relate to structures in the form of electronic circuits comprising a plurality of planar electronic devices formed in a single layer of active material.

BACKGROUND TO THE INVENTION

A variety of substantially planar electronic devices are known, and include side-gated transistors for example. In such a transistor, insulative features are typically formed to interrupt a single layer of active material (that is electrically or electronically active material, such as electrically conductive or semi-conductive material) to define a relatively narrow conductive channel of active material connecting a source region or terminal to a drain region or terminal, and also to define gate regions on either side of the conductive channel to which potentials can be applied to control the conductivity of the channel. Each gate region comprises a respective area or region of the layer of active material and which lies in the same plane as the conductive channel and the source and drain regions.

A variety of substantially planar electronic devices are disclosed in the following published patent applications of the current applicant, the contents of each of which are incorporated herein by reference: WO 02/086973 A2, WO 2006/008467 A1, and WO 2006/120414 A2. These planar electronic devices include diodes (exhibiting self-switching behaviour as a result of the asymmetrical arrangement of the insulative features with respect to the two terminals of the device), other self-switching devices (that is devices exhibiting a degree of self-switching behaviour as a result of the arrangement of the insulative features), side-gated transistors (including transistors with just a single side gate and transistors with a plurality of side gates such as two side gates on either side of the conductive channel), and logic gates (such as AND gates, NAND gates, OR gates, NOR gates, etc).

From these individual devices, it is desirable to construct electronic circuits or parts of electronic circuits comprising a plurality of such devices (defined in a common layer of active material) and interconnections between those devices and connections to voltage rails, supply rails, input/output rails, ground rails, etc. It is possible to provide some of the required interconnections in the common layer of active material itself. For example, the plurality of insulative features which define the various planar electronic devices may also define one or more connecting portions of active material, each of which provide an electrical connection between one region of the layer of active material (such as a terminal of one of the electronic devices) and another region (such as a terminal of another device, or a voltage rail). Clearly, however, in general it may not be possible to provide all of the electrical connections required to define an electronic circuit from the planar devices in the layer of active material itself, and it may be necessary to provide additional interconnections outside the layer of active material (i.e. outside the plane of the devices).

However, the field of forming electronic circuits from planar electronic devices is a relatively new one, and the state of the art contains little information applicable to the problem of how to form connections between co-planar electronic devices other than in the same plane. A wide variety of techniques are known for producing electrical connections in conventional multi-layer semiconductor devices, but these are typically not directly applicable to the field of planar electronic devices, which typically utilise different materials and have different constraints associated with them. For example, numerous known techniques for forming interconnect structures from copper in multi-layer semiconductor structures incorporate features specifically adapted to address the problem of preventing contamination of the conventional semiconductor material by copper ions, which would at least degrade performance. Furthermore, in some of these known techniques for producing copper interconnects in multi-level semiconductor structures, arrays of trenches and vias are often overfilled with copper and it is then necessary to remove much of this copper, in an additional process step, to leave behind just the pattern of trenches and inter-layer vias.

To reiterate, conventional interconnect techniques are typically addressing very different problems from those associated with the formation of electrical circuits from a plurality of co-planar electronic devices and those known techniques are therefore typically not applicable in the field of the present invention.

SUMMARY OF THE INVENTION

It is an object of certain embodiments of the invention to provide methods of manufacturing structures comprising one or more substantially planar electronic devices which may be used in the manufacture of electronic circuits from co-planar devices.

It is an object of certain embodiments to provide a method of manufacturing a structure comprising a plurality of co-planar electronic devices defined in a common layer of active material and including at least one electrical connection providing connection via an electrical path outside the layer of active material from one region of the active layer to another.

According to a first aspect of the present invention there is provided a method of manufacturing a structure comprising at least one substantially planar electronic device, the method comprising:

providing a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;

forming a patterned layer of dielectric material over the layer of active material, the patterned layer of dielectric material having an exposed surface patterned with at least a first depression arranged over said first terminal;

removing dielectric material at least from a base of said first depression to expose a surface of the first terminal and form a first hole through the dielectric material to the first terminal; and filling, at least partly, said first hole with electrically conductive material to form an electrical connection to the first terminal (e.g. an electrical connection through the dielectric material to the first terminal).

Thus, the electrical connection to the first terminal is formed by a method which first comprises forming a patterned layer of dielectric (i.e. insulating) material over the layer of active material. The first depression is then developed into a hole through to the active material using an appropriate technique and is then filled, at least partly.

In certain embodiments said electrical connection extends through the dielectric material to the first terminal.

It will be appreciated that in certain embodiments, the first electronic device may comprise one or more further terminals. For example, the first device may be a diode having just a first terminal and a second terminal, or the first device may be a side-gated transistor having a source terminal, a drain terminal, and at least one gate terminal.

In certain embodiments, said exposed surface is patterned with a plurality of depressions, the first depression being one of this plurality of depressions. Each depression may then be developed into a respective hole through to the underlying active material, or a respective trench to be at least partly filled with conductive material to form a conductive track let into (i.e. recessed into) a surface of the body of dielectric material.

In certain embodiments the first depression has a first depth and the plurality of depressions comprises a second depression having a second depth, the second depth being shallower than the first depth, said removing dielectric material further comprises removing dielectric material from a base of the second depression to form a trench having a base separated from the active layer by a thickness of dielectric material, and the method further comprises filling, at least partly, said trench with electrically conductive material.

In certain embodiments an etching process is used to remove dielectric material. The amount of etching (e.g. the length of time for which the etching is performed) can be suitably adjusted such that the deeper first depression (or plurality of first depressions) reaches the layer of active material but the trench or trenches do not. Thus, a multi-level profiled layer of dielectric material is produced over the layer of active material, with holes extending from an upper surface of the dielectric material down to the active layer and trenches extending laterally in the layer of dielectric material.

It will be appreciated that different embodiments may utilise a wide variety of different shapes and sizes of first and second depressions. For example, in plan view the first depression may be circular, square, rectangular, or indeed have any other shape such that the corresponding hole formed through to the active layer beneath has the same shaped cross section. Similarly, the or each second depression may be circular, square, rectangular, elongate, or have any other shape such that the corresponding trench formed in the layer of dielectric material has a corresponding cross section. In certain embodiments, at least one of the second depressions may be generally elongate, and follow a desired path (which may include one or more straight sections, one or more curved sections, and one or more changes in direction) such that when the corresponding trench is filled, at least partly, with electrically conductive material a correspondingly-shaped conductive track is formed in the surface of the body of dielectric material.

In certain embodiments, the method comprises filling, at least partly, the first hole and the trench with electrically conductive material at the same time (i.e. simultaneously, as part of a single filling step or process).

In certain embodiments, the first and second depressions are separate, but in certain other embodiments the first and second depressions are arranged to meet one another such that the trench extends from the first hole. Thus, when the first hole and the trench are at least partly filled with electrically conductive material, an electrical connection is made which extends from a portion of the layer of active material, up through the dielectric material, and then along the trench in a direction generally parallel to the underlying layer of active material.

In certain embodiments, the plurality of depressions comprises a third depression having substantially said first depth and being arranged over an area of the layer of active material, said removing dielectric material further comprises removing dielectric material from a base of the third depression to expose a surface of the underlying area of active material and form a second hole through the dielectric material to the underlying active material; and the method further comprises filling, at least partly, said third hole with electrically conductive material to form an electrical connection to the underlying active material (e.g. an electrical connection through the dielectric material to the underlying active material).

In certain embodiments, the first, second, and third depressions are arranged to meet such that the trench connects the first and second holes.

In certain embodiments the method further comprises filling, at least partly, the first and second holes and the trench with electrically conductive material so as to form an electrical connection between the first terminal and the area of active material underlying the second hole. Thus, in certain embodiments the method comprises the step of forming an electrical connection which bridges from one region of the layer of active material to another. This bridging connection can thus bridge over one or more insulative features electrically separating the relevant areas from one another in the plane of the active layer. Clearly, such methods are particularly applicable to the formation of electrical circuits from a plurality of planar electrical devices formed in the single, common layer of active material.

Conveniently, the method may comprise filling, at least partly, the first and second holes and the trench with the electrically conductive material at the same time as one another, for example in a single processing step.

In certain embodiments this filling, at least partly, of the first and second holes and the trench with electrically conductive material at the same time comprises depositing conductive material over the structure to provide a conformal coating of conductive material which provides an electrical connection between the first terminal and the active material exposed by the second hole.

It will be appreciated that methods embodying the invention may be used to form bridging connections between various regions of the layer of active material. In certain embodiments the bridging may be between a terminal of one planar device and a terminal of another planar device. Alternatively, the bridging connection may be between a terminal of one device and an area of active material which does not form part of a device terminal, such as a voltage rail, a ground rail, or other circuit element.

In certain embodiments, the forming of the patterned layer of dielectric material comprises using an imprint tool to form the or each depression, and the method may further comprise using the imprint tool to form the or each depression directly in a surface of the dielectric material.

In certain embodiments, the exposed surface of the formed patterned layer is patterned with a plurality of depressions, and the method comprises using the imprint tool to form at least two of the plurality of depressions at the same time. For example, in certain embodiments a rigid or flexible imprint tool in the form of a stamp or shim may be used to form all of the plurality of depressions at the same time, i.e. in a single imprinting process. In alternative embodiments, the imprint tool may be supported on a roller and then rotated on the roller as the layer of active material is translated past it to sequentially imprint the plurality of depressions in the surface of the layer of dielectric material.

In certain embodiments, the imprint tool comprises a base surface and a plurality of imprint features, each imprint feature being arranged to form a respective depression in the layer of dielectric material and being raised a respective height above the base surface.

In certain embodiments said plurality of imprint features contain at least one imprint feature having a first height and at least one imprint feature having a second height, the second height being smaller than the first height.

Thus, the first height may correspond to the first depth, and the second height may correspond to the second depth, such that the imprint features having the first height are used to form the depressions which are developed into the holes which extend completely through the dielectric material to the active layer, and the imprint features having the second height are used to form the depressions which are developed into trenches, for example for forming lateral connecting tracks or contact pads or other required structures.

Thus, it will be appreciated that in certain embodiments the imprint tool is a multi-height tool, having a multi-height pattern of imprint features. In other words, the imprint tool may have a surface provided with a multi-level relief pattern.

In certain embodiments, the insulative features are insulative trenches formed in the layer of active material, and the step of forming the patterned layer of dielectric material comprises filling the insulative trenches with the dielectric material.

However, in alternative embodiments other forms of insulative features may be employed.

In certain embodiments, the step of forming the patterned layer of dielectric material comprises forming the patterned layer of dielectric material directly on the layer of active material such that said dielectric material is directly in contact with said active material.

In certain alternative embodiments, the patterned layer of dielectric material is formed on one or more additional layers of dielectric material which have already been formed on the layer of active material, such that the patterned layer of dielectric material is not in direct contact with the layer of active material. The previously formed layer or layers of dielectric material may be referred to as one or more intermediate layers. In certain embodiments, the intermediate layer or layers may be formed from the same dielectric material as the later-formed patterned layer of dielectric material, but in alternative embodiments different dielectric materials may be used for different layers.

Thus, it will be appreciated that, in certain embodiments, the method further comprises forming at least one intermediate layer of dielectric material over the layer of active material. In such embodiments, the patterned layer of dielectric material is formed over the at least one intermediate layer, such that the patterned layer is not directly in contact with the active material.

In certain embodiments, the step of providing the layer of active material with the plurality of insulative features formed therein comprises using a first imprint tool to form the plurality of insulative features in the layer of active material.

This step of providing, in certain embodiments, comprises providing an unpatterned layer of said active material, using said first imprint tool to form a patterned layer of insulative material over the unpatterned layer, the patterned layer of insulative material having a surface patterned by the first imprint tool with a plurality of recesses, each recess corresponding to a respective insulative feature, and etching to develop each recess into an insulative trench interrupting the layer of active material.

In certain embodiments, the insulative material and dielectric material are different materials, but in certain other embodiments the insulative material and dielectric material are the same.

In certain embodiments, the step of forming the patterned layer of dielectric material comprises using a second imprint tool to form the or each depression. In such embodiments the method may further comprise the step of aligning the second imprint tool with the pattern of insulative features formed in the layer of active material.

Various techniques may be employed for this alignment process. For example, optical techniques may be used, and in certain embodiments the second imprint tool may be a transparent stamp, shim, or mask such that the patterned layer of active material beneath it can be observed.

In certain embodiments, the step of removing dielectric material comprises etching. A variety of etching techniques may be employed, the particular etching technique being selected to suit the materials of the structure. For example, etching techniques which may be employed in embodiments of the invention include chemical etching, solvent stripping, lift-off, plasma etching (e.g. oxygen), UV/ozone treatment, ion-milling, reactive-ion etching, dry-etching.

In certain embodiments, the or each step of filling comprises filling the or each hole or trench at least partly with a liquid.

For example, in certain embodiments the liquid may be a conductive ink. Solution processing techniques for deposition conductive inks may include, but are not limited to coating (spin, dip, blade, bar, spray, slot-die) or printing (inkjet, gravure, offset, screen, flexo). An advantage of using a liquid for the filling step or steps is that it provides a convenient way of delivering electrically conductive material just to the holes and trenches, and the need for an additional step to remove "overfill" material can be somewhat or completely avoided. The dielectric may be coated, for example with a fluorinated silane or other fluorinated coating, or formulated so as to make the surface substantially hydrophobic or lyophobic, the latter for example discourages settlement of colloidal metal inks such that the ink would tend to settle within the lowest depression or depressions. The top surface may be optionally cleaned after solution deposition of the conductive ink. Alternatively a further layer of dielectric material may be coated after deposition of the conductive ink to substantially planarise the depressed regions before cleaning of the surface. Examples of conductive inks may include but are not limited to metal inks (e.g. silver), nanoparticle formulations (which may require post-deposition annealing or sintering), carbon nanotubes, polymer (e.g. polyaniline, PEDOT:PSS), solution-processable transparent conductive oxides (e.g. sol-gel formulations of ZnO, IZO).

In certain embodiments the or each step of filling comprises filling the or each hole or trench at least partly with a conductive material using plating such as electroplating or electroless plating.

In certain embodiments the or each step of filling comprises filling the or each hole or trench at least partly with a conductive material using vacuum processes, such as evaporation or sputtering.

In certain embodiments one or more additional process steps may be employed to remove undesired areas of conductive material. These may include, but are not limited to, one or more of ablation (e.g., laser), etching (chemical, dry, reactive-ion, plasma), polishing (chemical, mechanical) and grinding.

In certain embodiments, the method further comprises providing a substrate arranged to support the layer of active material. In certain embodiments the substrate is a multi-layer structure, but in certain alternative embodiments the substrate comprises a single layer of substrate material. The substrate material and/or the material of each of the substrate layers in certain embodiments may be selected from a list comprising: glass (rigid or flexible); quartz; polymer (e.g. polyethylene naphthalate or polyethylene terephthalate); polymeric foil; paper; insulator coated metal (e.g. coated stainless-steel); cellulose; polymethyl methacrylate; polyvinylalcohol; polyvinyl acetate; polyvinyl pyrrolidone; polyvinylphenol; polyvinyl chloride; polystyrene; polyethylene naphthalate; polyethylene terephthalate; polyamide (e.g. Nylon); poly(hydroxyether); polyurethane; polycarbonate; polysulfone; polyarylate; acrylonitrile butadiene styrene, polyimide, Benzocyclobutene (BCB), $Al_2O_3$, $SiO_xN_y$, $SiO_2$, $Si_3N_4$ In certain embodiments, the method further comprises arranging the plurality of insulative features to define a plurality of planar electronic devices in the layer of active material and to define a first plurality of electrical connections between said devices in the layer of active material.

In certain embodiments, the method further comprises forming a plurality of said holes, and said trenches at least partly filled with electrically conductive material to form a second plurality of electrical connections between said devices outside the layer of active material.

In certain embodiments, the method further comprises forming a plurality of said holes, each extending through the dielectric material to a respective area of active material, at least partly filling each hole with electrically conductive material to form an electrical connection through the dielectric material to the respective area of active material, and forming a third plurality of electrical connections between the at least partly filled holes over the layer of dielectric material.

In certain embodiments, forming the third plurality of electrical connections over the layer of dielectric material comprises printing, e.g. printing with a conductive ink to form electrical tracks or connections.

It will be appreciated that such printing techniques may be used to selectively connect filled holes, but may also be used to provide connections to other parts of the structure, for example connections to conductive pads or regions let into (i.e. recessed into) the "upper" surface of the body of dielectric material.

In certain embodiments the forming step is arranged such that the exposed surface is patterned with a further depression arranged over a further area of active material, the removing step further comprises removing dielectric material from a base of said further depression to expose a surface of the further area and form a further hole through the dielectric material to the further area; and the filling step further comprises filling, at least partly, said further hole with electrically conductive material to form a further electrical connection through the dielectric material to the further area.

In such embodiments the removing step may comprise etching dielectric material from the base of the first depression and from the base of the further depression at the same time.

The method may further comprise forming an electrical connection over the dielectric material and extending between the at least partly filled first and further holes so as to electrically connect the first terminal and the further area of active material.

In certain embodiments this forming of the electrical connection over the dielectric material comprises forming a track of electrically conductive material by printing.

In certain embodiments this forming of the electrical connection over the dielectric material comprises forming a track of electrically conductive material by proximity or contact printing. In certain embodiments, the insulative features define a plurality of planar electronic devices, the first device being one of these devices, and each device being selected from a list comprising: a diode; a transistor; a self-switching device; a side-gated transistor; and a logic gate.

In certain embodiments, the structure comprises an electronic circuit.

In certain embodiments, the active material is a material selected from a list comprising: crystalline inorganic semiconductors including group IV semiconductors such as silicon, germanium or the like; III-V semiconductor such as gallium arsenide, indium phosphide; metal oxides such as zinc oxide; amorphous inorganic semiconductor such as a-Si, binary metal oxides such as InZnO, ternary metal oxides such as GaInZnO; polymer semiconductors such as polyalkylthiophenes (e.g. P3HT), polyarylamines (e.g. PTAA), copolymers of fluorene and thiophene, polyparaphenylenevinylene (PPV); crystalline organic semiconductors such as pentacene or rubrene; other examples of n- or p-type organic semiconductor materials are described in the following references: *J. Am. Chem. Soc.*, 2004, 126, 13480, *Nature*, 2009, DOI:10.1038, *Chem. Rev.* 2007, 107, 953-1010; *Chem. Rev.* 2007, 107, 1066-1096 and U.S. Pat. No. 7,029,945; *Angew. Chem. Int. Ed.* 2008, 47, 452-483 (precursor organic semiconductors); US2004038459A1, *Nature Materials VOL* 4 Aug. 2005 p 601, *Nature Materials* VOL 5 Dec. 2006 p 950, EP1579518A1 (blends of organic semiconductors with semiconductors).

The active material may optionally be chemically doped with one of the following:

For p-type: 2,3,5,6-tetrafluoro-7,7,8,8-tetracyano-quinodimethane (F4-TCNQ); $WO_3$, $MoO_3$ or $V_2O_5$; Lewis acids such as $FeCl_3$ or $SbCl_5$; Ruthenium tris-(terpyridine), Tetrakis_(1,2,3,3a,4,5,6,6a,7,8-decahydro-1,9,9b-triazaphenalenyl)_ditungsten_(II));

For n-type: Acridine Orange Base (AOB, $C_{17}H_{19}N_3$); Li; Cs; Rhodamine P; and examples contained within: U.S. Pat. No. 7,161,292, EP1837926, WO2007DE00587, EP1837927 (A1), WO2007107356, EP1643568 (A1), EP1538684 (A1), EP1860709 (A1), US2007278479, US2007148812, US2007145355;

Other examples of printable inorganic semiconductors include metal oxides such as indium tin-oxide, zinc oxide, titanium dioxide, indium zinc-oxide, gallium indium zinc oxide or metal oxides as described in *Appl. Phys. Lett.* 88, 123509 (2006) or WO2005112045, the contents of which are incorporated herein by reference; silicon inks such as described in U.S. Pat. No. 7,078,276, U.S. Pat. No. 6,878,184 and U.S. Pat. No. 7,259,100.

Doping or control of carrier concentration within the active layer can also be achieved using induced dipole effects as described in UK patent application no. GB819684.2, incorporated in its entirety by reference herein. Doping of metal oxide semiconductors can be achieved by substitution with a dopant such as B, Al, N, P, As, Group I metals, Cu. P-type and n-type semiconductors can be produced depending on doping, chemical and physical treatment conditions, such as annealing described for example in US2008299702A1.

In certain embodiments, the dielectric material is a material selected from a list comprising organic insulator such as polymethyl methacrylate, polybutyl methacrylate, polyethyl methacrylate, polyvinyl acetate, polyvinyl pyrrolidone, polyvinylphenol, polyvinylchloride, polystyrene, polyethylene, polyvinyl alcohol, polycarbonate; inorganic insulator such as silica, silicon nitride, metal oxide (e.g. $Al_2O_3$, $HfO_2$, $TiO_2$, $Ta_2O_5$), metal nitride (AlN), silicone, silioxane, $SiN_x$, parylene.

In certain embodiments, the insulative material is a material selected from a list comprising thermoplastics, polyethylene, polyethylene terephthalate, PEEK, poly hydroxybutyrate, polymethyl methacrylate, polyvinylalcohol, polyvinyl acetate, polyvinyl pyrrolidone, polyvinylphenol, polyvinyl chloride, polystyrene, polyamide (e.g. Nylon), poly(hydroxyether), polyurethane, polycarbonate, polysulfone, polyarylate, acrylonitrile butadiene styrene, polyimide, benzocyclobutene (BCB), photoresist, 1-Methoxy-2-propyl acetate (SU-8), polyhydroxybenzyl silsesquioxane (HSQ), uv curable liquid resin, sol-gel composition.

As will be appreciated from above, in certain embodiments the patterned layer of dielectric material is formed directly on the layer of active material. However, certain alternative embodiments further comprise forming at least one intermediate layer of dielectric material over the layer of active material, and wherein said patterned layer of dielectric material is formed over said at least one intermediate layer, such that said patterned layer is not directly in contact with said active material.

In certain embodiments, this forming of at least one intermediate layer comprises forming a single intermediate layer of dielectric material. In such embodiments, said filling may comprise forming a continuous coating of electrically conductive material inside the first hole and extending to cover dielectric material adjacent the first hole. Then, the method may further comprise removing dielectric material covered with said coating adjacent the first hole. Such embodiments provide the advantage that a coating of electrically conductive material can conveniently be deposited over the entire surface of the structure (incorporating one or more holes and trenches) and then the unwanted, excess conductive material can be easily removed by removing dielectric material, by one of a number of suitable techniques.

In certain embodiments, forming at least one intermediate layer comprises forming a first intermediate layer in direct contact with the active material, and a second intermediate layer over the first intermediate layer.

In such embodiments, the method may further comprise forming an undercut in the second intermediate layer inside the first hole, before the filling step. Then, the filling may comprise forming a coating of electrically conductive material inside the first hole and over dielectric material adjacent the first hole, where the undercut provides an interruption in the coating. Again, the method may then further comprise removing dielectric material of the second intermediate layer so as to remove conductive material coating dielectric material adjacent the first hole. The undercut technique is advantageous in that it provides the interruption in the conductive coating, and so facilitates removal of dielectric material of the second intermediate layer to lift off conductive material where it is not required.

Another aspect of the present invention provides a method of forming an electrical connection between a first portion of a layer of active material and a second portion of said layer, the method comprising:

forming a first layer of dielectric material over the first and second portion;

forming a patterned second layer of dielectric material over the first layer, the patterned second layer having an exposed surface patterned with a first depression arranged over the first portion, a second depression arranged over the second portion, and a third depression connecting the first and second depressions;

removing dielectric material at least from the bases of the first, second, and third depressions to form a first hole through the layers of dielectric material to expose a surface of the first portion, to form a second hole through the layers of dielectric material to expose a surface of the second portion, and to leave at least a portion of the first layer between (separating) the first and second holes;

forming a coating of electrically conductive material inside the first and second holes, over said portion of the first layer, and over portions of the second layer adjacent the first and second holes so as to form said electrical connection.

It will be appreciated that the first portion of the layer of active material may be a first terminal of a first planar device, and the second portion may be a second terminal of the same device, a first terminal of another planar device, or indeed some other portion of the layer of active material in which the planar device is formed (e.g. defined by insulative features).

It will also be appreciated that, in this aspect of the invention, the coating of electrically conductive material may be continuous, and/or conformal.

The method may then further comprise removing dielectric material of said second layer so as to remove electrically conductive material not inside the first and second holes or covering said portion of the first layer.

Thus, this removing of dielectric material of the second layer can be used to lift off conductive material where it is not required.

In certain embodiments, the method further comprises forming a third layer of dielectric material between the first layer and the second layer, and forming undercuts in the third layer inside the first and second holes before forming the coating.

Thus, the third layer may be formed over the first layer, and then the second layer may be formed over the third layer. The use of the third layer and associated undercutting technique provide the advantage that an interruption or interruptions may be provided in the conductive coating so as to facilitate lift off of conductive material where it is not required, leaving just conductive material providing the electrical connection between the first and second regions of active material.

Another aspect of the invention provides a structure comprising:

a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;

a layer of dielectric material formed over the layer of active material; and a first hole in the layer of dielectric material, extending through the dielectric material to the first terminal, and being filled, at least partly, with electrically conductive material to form an electrical connection through the dielectric material to the first terminal.

In certain embodiments the structure further comprises a further hole in the layer of dielectric material, the further hole extending through the dielectric material to a further area of the layer of active material, and being filled, at least partly, with electrically conductive material to form a further electrical connection through the dielectric material to the further area.

In certain embodiments the structure further comprises a conductive track extending in a plane substantially parallel to the layer of active material and arranged to connect the at least partly filled first and further holes to provide an electrical connection between the first terminal and said further area.

In certain embodiments this conductive track is arranged in a trench in a surface of the layer of dielectric material, and in other embodiments this conductive track is arranged on a surface of the layer of dielectric material. In yet further embodiments, a plurality of conductive tracks may be employed, one or more being let into the surface of the dielectric layer, and one or more being formed on a substantially flat surface of the layer (i.e. not recessed into the layer).

Another aspect of the invention provides an electrical circuit comprising a structure in accordance with any of the above-mentioned aspects.

Another aspect of the invention provides an electrical circuit comprising:
 a layer of active material having a plurality of insulative features formed therein, each insulative feature at least partly inhibiting electrical current flow in said layer, and the plurality of insulative features defining a plurality of planar electronic devices in the layer of active material and a first plurality of electrical connections between said devices in the layer of active material;
 a layer of dielectric material covering said layer of active material;
 a plurality of holes formed in the layer of dielectric material, each hole extending through the layer of dielectric material to a respective area of the layer of active material and being filled, at least partly, with electrically conductive material to form a respective electrical connection through the dielectric material to the respective area of active material; and
 a plurality of conductive tracks arranged to provide connections between the at least partly filled holes and so provide connections outside the layer of active material between different areas of the layer of active material, each conductive track being formed in or on a surface or the layer of dielectric material.

Thus, the circuit may comprise a plurality of substantially co-planar devices, with at least some of the device interconnections being provided in the layer of active material itself, and at least some other device interconnections being provided outside the plane of the active layer (e.g. bridging over in-plane insulative features and being insulated from the active layer by the dielectric material covering it). The out-of-plane interconnections penetrate the dielectric layer at desired locations to contact the underlying active material.

BRIEF DESCRIPTION OF THE DRAWINGS

Embodiments of the invention will now be described with reference to the accompanying drawings of which:

FIGS. 8a-c illustrate a 3-stage ring oscillator which has been formed from substantially planar electronic devices and electrically conductive material which extends beyond the ring oscillator to an external contact pad in a method embodying the invention;

DETAILED DESCRIPTION OF EMBODIMENTS OF THE INVENTION

Figure 1A:
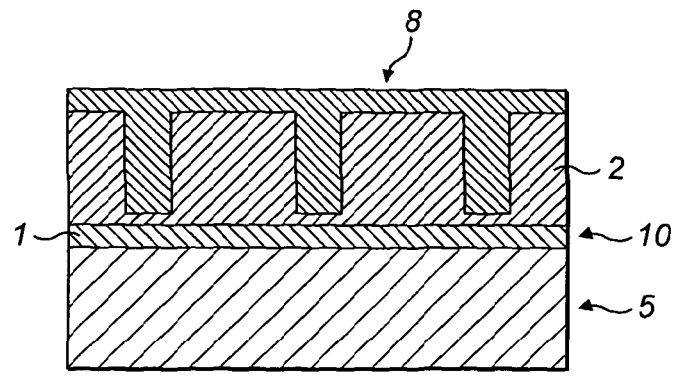
FIGS. 1a-1h illustrate steps in a method of manufacturing a structure comprising at least one substantially planar electronic device and embodying the invention.
Figure 1B:
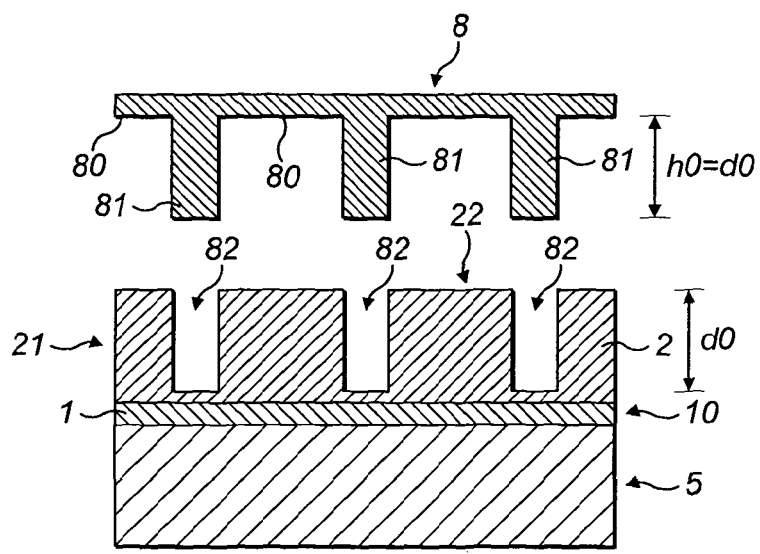
Figure 1C:
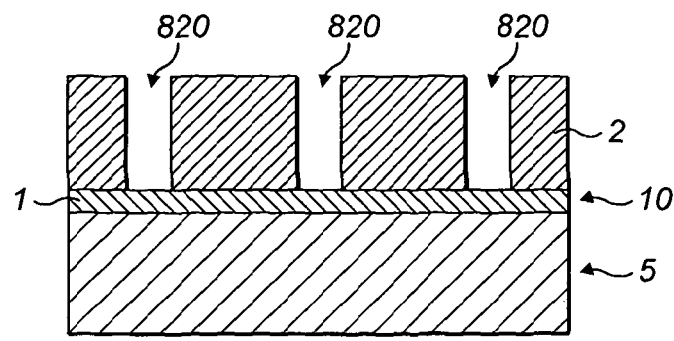
Figure 1D:
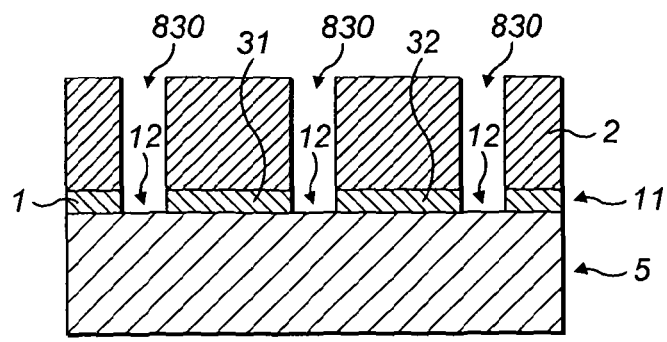
Figure 1E:
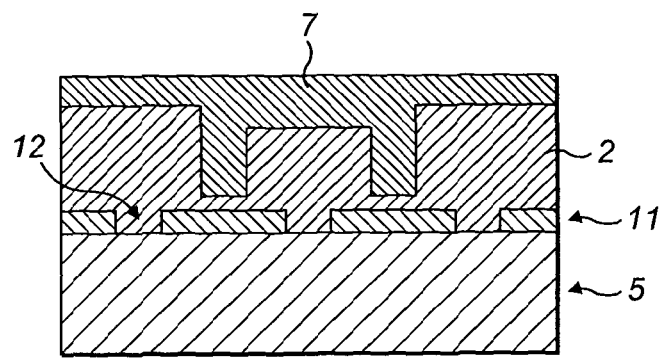
Figure 1F:
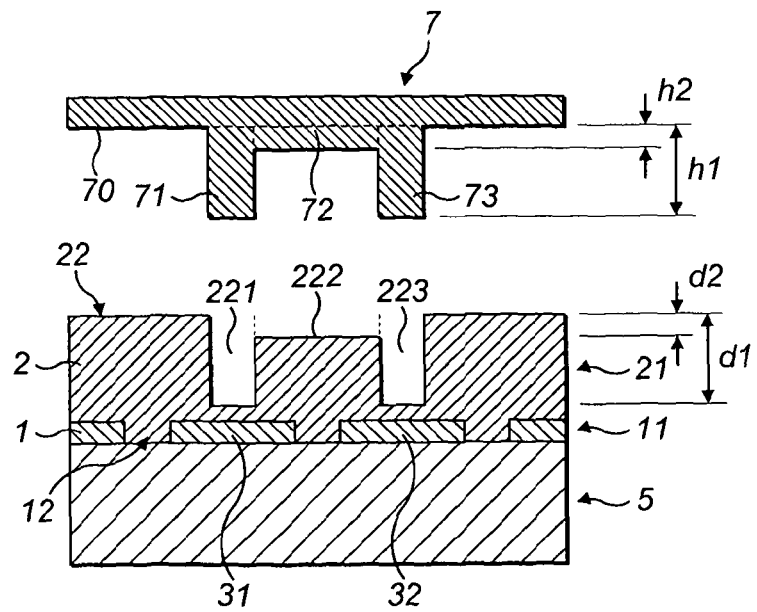
Figure 1G:
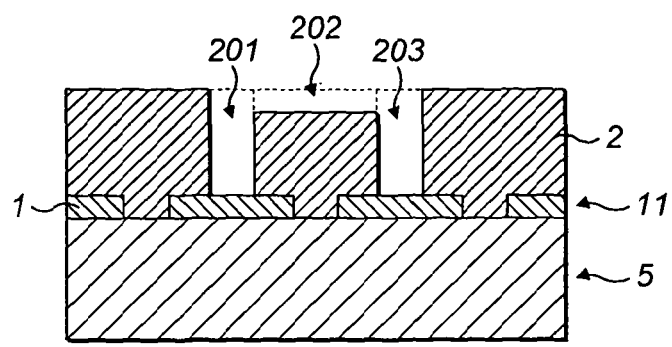
Figure 1H:
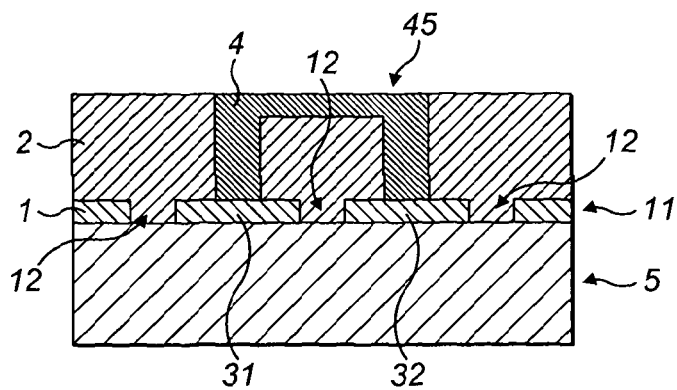

Referring now to FIGS. 1a-1h these collectively show a series of steps in the formation of electrically conductive features in a method embodying the invention. FIG. 1a shows an unpatterned layer 10 of active material 1, in this case semiconductor, deposited onto a substrate 5. A dielectric material 2 has been deposited on top of the unpatterned layer 10 of active material 1 and an imprint tool 8 or template is being urged into the dielectric material 2. The tool 8 is applied under a given pressure and temperature and may be optionally irradiated either from beneath or from above (if the imprint tool is transparent to the particular wavelength). Typically the radiation would be UV and the dielectric material 2 would be sensitive to such UV light so as to substantially harden or cross-link during exposure. Typical techniques include nanoimprint (thermal or UV) and methods for achieving such imprint will be well-known to those skilled in the art. FIG. 1b shows the next step after the imprint tool 8 has been withdrawn with the dielectric material 2 substantially retaining the pattern or template of the imprint tool used. The imprint tool, shown in FIG. 1b, comprises a plurality of imprint features 81, each raised a height h0 above a base surface 80 of the tool. Each imprint feature has produced a corresponding trench, channel, recess or depression 82 in the exposed surface 22 of the layer of dielectric material, having a depth d0 substantially equal to h0. In this example, a relatively thin portion of dielectric material 2 remains at the bottom or base of each imprinted feature 82, still covering the active material, but in other embodiments the imprinted features may extend fully to the active material. Returning to the current embodiment, etching is now used to remove any residual layer which was remaining after the imprint step shown in FIG. 1a. in other words, etching is used to remove the dielectric material still covering the active material at the base of each imprinted feature 82. In certain embodiments a polymer dielectric 2 is used, and is etched using an oxygen plasma. After etching the structure shown in FIG. 1c is achieved, with the originally imprinted features 82 having been developed into trenches, channels, depressions, grooves etc. extending completely down to the surface of the active material 1. Thus, the imprinted areas above the active material 1 are completely clear of dielectric material, whereas the unimprinted areas, i.e. the areas of dielectric material that were between imprint features 82 on the tool 8, have a residual protective dielectric layer covering them. FIG. 1d shows the next step in which the exposed active material beneath the imprinted areas (i.e. at the bases of the features 820) is etched away to make completely insulating features in the layer of active material, leaving trenches, channels etc. 830 which go down to the top of the substrate 5 (i.e. the features 830 formed by imprinting then etching extend from an "upper" surface of the dielectric material layer completely through the dielectric and active material layers, to the underlying substrate 5, thus completely interrupting the active material layer). In certain embodiments this etching of the active material is a reactive ion-etching or wet-etching technique/process (in the case of metal oxides a hydrogen/methane plasma can provide a substantially anisotropic etch), although it will be appreciated that alternative embodiments may use other suitable techniques. The techniques employed are such that, while the active material is being etched to form insulative features in the active layer, the remaining dielectric material is largely unaffected, or at least etches at a rate sufficient to ensure that there is a continuous protective layer 21 of dielectric material over each portion or area of the active material 1 that was not directly beneath an imprint feature 82, for the duration of the etching process. In this embodiment, the imprinting and etching steps have been arranged such that the structure shown in FIG. 1d possesses a patterned layer 11 of active material 1, The active material has been patterned with a plurality of insulative features 12. These insulative features formed in the layer of active material 1 define a substantially planar electronic device comprising at least a first terminal 31 and a second terminal 32, each terminal comprising a respective area of active material 1 in the layer 11. FIG. 1e illustrates a second imprint step in the method, whereby a further imprint tool 7 is aligned to the first imprinted pattern (i.e. with the substantially planar electronic device) so as to align with target contact areas (in this example the first and second terminals 31,32) on the patterned active layer. In this example the dielectric material 2 is applied before the second imprint tool 7 is urged down and the additional dielectric material 2 fills-in the patterned area of the active material. It is possible, of course, to pre-deposit an alternative dielectric material prior to the imprint step if one wishes to change the dielectric constant of the material within the insulative feature. Some or all of the previously imprinted dielectric material from FIGS. 1a-1d may be optionally removed prior to the second imprint step shown in FIG. 1e. As can be seen in FIG. 1e, the insulative features 12 in the patterned layer of active material now comprise dielectric material filling the previous voids or interruptions to the active layer. Similarly to FIG. 1a the imprint tool 7 is applied with pressure and at a given temperature, with optional irradiation. In this case the imprint tool 7 has features with two different heights. In certain embodiments It is possible to have features with the same height or multiple (i.e. at least two) features with (at least two) different heights. FIG. 1f shows the next step after withdrawal of the imprint tool with the dielectric material 2 substantially retaining the features of the imprint template 7. As can be seen, in this embodiment the imprint tool 7 comprises a base surface 70, and first 71, second 72 and third 73 imprint features raised above that base surface (i.e. extending from that base surface) by respective heights. The first and third features 71, 73 have a first height h1, and the second feature 72 has a smaller height, h2. The first imprint feature 71 has formed a corresponding first depression 221 of depth d1 (equal to h1) in the exposed surface 22 of the layer of dielectric material, above the first terminal 31 of the planar device. Similarly, the third imprint feature 73 has formed a third depression 223 of depth d1 over the second terminal area 32. It will be appreciated that in other embodiments, the first and third depressions may be formed over other portions of the active layer, i.e. they are not necessarily formed over terminal areas of a single device—they may be formed over terminal areas of different devices, or over a terminal of one device and some other portion, e.g. a supply rail, an input/output terminal etc of the active layer, or indeed any portion of the active layer as required to manufacture the desired structure. The second imprint feature 72 has formed a second, shallower depression 222 of depth d2 (equal to h2) connecting the first and third depressions 221, 223. In other words, the second depression 222 extends laterally, parallel to the active layer, from the first depression to the second depression. Thus, the multi-level imprint tool 7 has produced a corresponding multi-level relief pattern or profile in the exposed surface 22 of the layer of dielectric material 22. In other words, the imprint tool 7 has been used to produce a patterned layer of dielectric material above the patterned layer of active material, the patterned dielectric layer having a surface in which depressions of different depths have been formed. This second imprinting process has resulted in dielectric material being present at the bases of each of the first and third depressions 71, 73 (and of course at the base of the shallower second depression), covering the underlying active material. In this embodiment, etching is again used to remove any residual layer from the imprint step in FIG. 1e, so as to expose the top surface of the active material 1. In other words, etching is used to remove dielectric material from the patterned layer 21 such that the first and third depressions are developed respectively into first and second holes 210, 203, each extending completely through the layer of dielectric material to a respective area 31, 32 of the layer of active material. At the same time, material is etched away from the base of the second depression (and indeed from the uppermost surfaces of the dielectric layer, at either side of the depressions), but the etching is suitably terminated such that the structure shown in FIG. 1g is achieved. Holes 201 and 203 extend through to the terminal areas 31, 32, and the second depression 222 has been developed into a trench 202 extending from the first to the second hole. At the base of the trench, dielectric material still covers the underlying patterned active layer. In certain embodiments it may be necessary to employ two or more different etch-processes where there is a plurality of materials deposited on the active material. For example the active material may have a thin-layer of dielectric material such as an inorganic metal oxide and a thicker layer of organic insulator such as a polymer dielectric. FIG. 1h shows a final step in which the patterned area of dielectric material (i.e. the hole/trench pattern) is filled-in with an electronically conductive material 4 so as to form a conductive pathway (i.e. an electrical connection 45, out of the plane of the active layer) from one area 31 of the active material to another area 32 of the active material and which crosses over an insulative feature 12 formed within the patterned layer 11 of active material 1.

Figure 2:
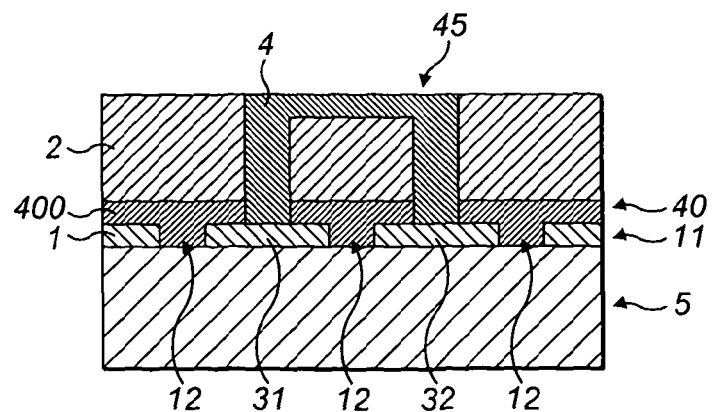
FIG. 2 shows a schematic of a conductive material bridging from one area of active material to another area of active material, crossing over insulative features within the active material, formed by a method embodying the invention.

Referring now to FIG. 2 this shows a schematic of part of a structure or device embodying the invention and having been manufactured using a method embodying the invention. The structure comprises a layer 11 of active material 1 above a substrate 5 (i.e. supported by a substrate), with insulative features 12 defined in the active layer 11 so as to form a section of a substantially planar electronic device. Conductive material 4 forms an electrical connection from one area 31 of active material 1 to another area 32 of active material. The device has been formed using a method similar to that described with reference to FIGS. 1a-1h but in this instance there is an additional dielectric layer 40 between the active layer and the insulative imprint resist material 2. The additional dielectric layer 40 has been etched after the removal of residual imprint resist material 2 so as to expose the top surface of the active material 1. The conductive material 4 has then been deposited such that it directly contacts with the active material 1. It will be appreciated that the dielectric material 400 of the additional dielectric layer 40 also fills voids formed to interrupt the active layer; that material thus forms part of the insulative features 12 in the layer of active material.

Figure 3A:
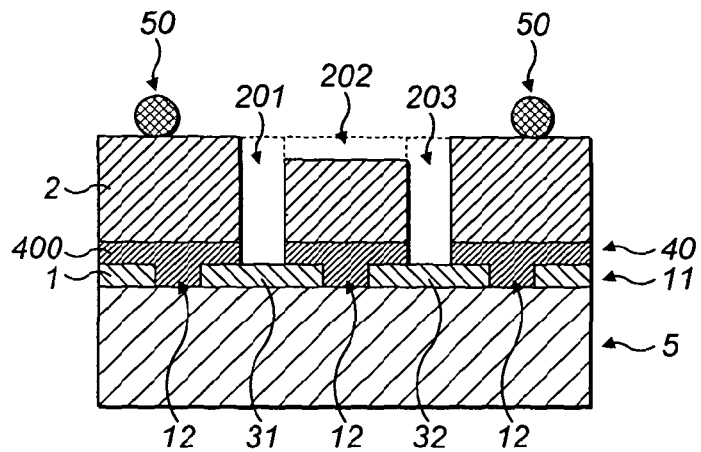
FIG. 3a-c illustrate a surface which is repelling or "de-wetting" a conductive ink, thus encouraging flow into the depressed regions.
Figure 3B:
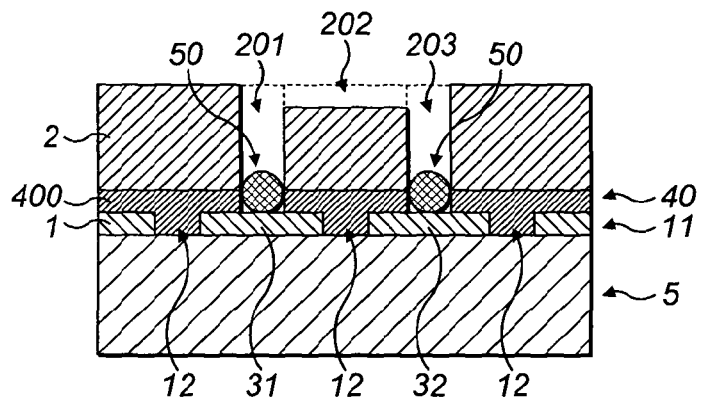
Figure 3C:
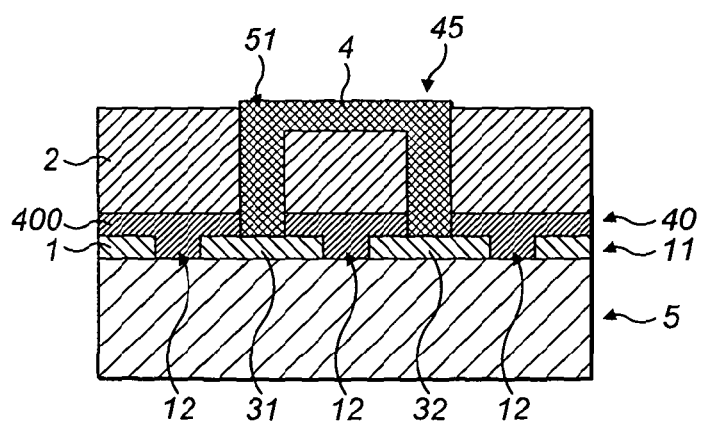

Referring now to FIGS. 3a-c this shows a layer 11 of active material 1 above a substrate 5, with insulative features 12 defined in the active layer so as to form a section of a substantially planar electronic device. The insulative features 12 within the layer 11 of active material have been filled-in with dielectric material 400, on top of a layer 40 of which is a residual imprint resist material 2. The structure has been formed in a similar fashion to that described above in relation to FIGS. 1a-1h and FIG. 2. The schematic shows two droplets 50 of a conductive ink which have been placed on the top of the imprint resist material 2. This imprint resist material 2 is formulated so as to repel the conductive ink particles, for example it may be lyophobic and, as such, repels colloidal metal inks. Alternatively, in other embodiments, imprint resist material 2 may be formulated or the surface of imprint resist material 2 may be physically treated or chemically modified so as to make the surface repellent to a particular conductive ink. FIG. 3b shows the next stage in which the conductive ink particles 50 have fallen into the recesses (i.e. the holes 201, 203 and trench 202) formed in the imprint resist material 2. FIG. 3c shows a later stage after many conductive ink particles have fallen into the recess and the ink has been cured so as to form a continuous layer or body 51 of conductive material 4 forming an out-of-plane connection 45 between one region 31 of the active layer and another 32. Optionally the surface of imprint resist material 2 may be cleaned, e.g. by etching or polishing, after the curing of conductive material 4 to remove any residual material which is not desired.

Figure 4A:
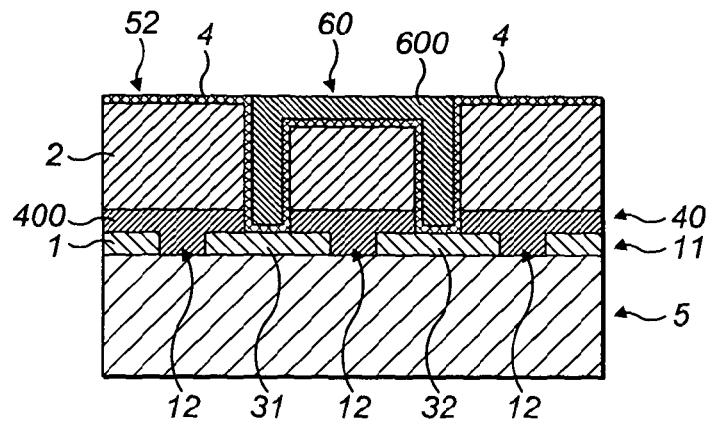
FIG. 4a-b illustrate a method of filling-in the depressed regions with insulating or dielectric material to make them substantially planar prior to cleaning of the top surface to remove residual electrically conductive material.
Figure 4B:
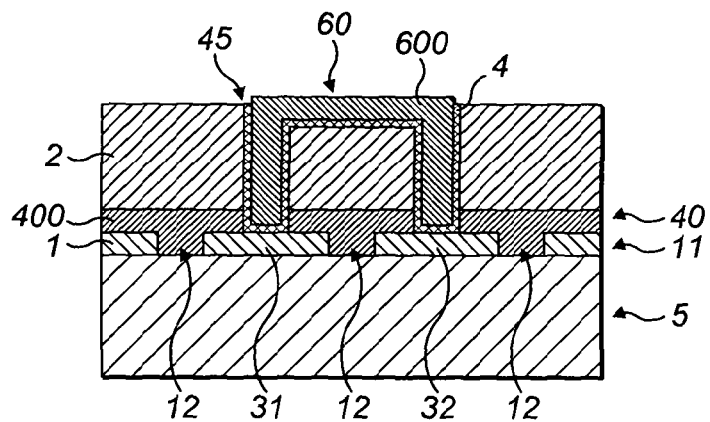

Referring now to FIG. 4a this shows a layer 11 of active material 1 above a substrate 5, with insulative features 12 defined in the active layer 11 so as to form a section of a substantially planar electronic device. The insulative features within the active material layer 11 have been filled-in with dielectric material 400, on top of a layer 40 of which is a residual imprint resist material 2. A covering, coating, or layer 52 of conductive material 4 has been deposited along the exposed surfaces of imprint resist material 2 and dielectric material 400. A layer or body 60 of planarising material 600, such as a polymer, has been deposited into the recess in the coating 52 such that the level of planarised material 600 is the same as the upper level of the conductive material 4. FIG. 4b shows the next stage in which the exposed portion of the covering of conductive material 4 has been removed, e.g. using etching. The remaining portion of the covering of conductive material 4 thus forms a connection 45 only from one area 31 of active material 1 to a second area 32 of active material 1.

Figure 5:
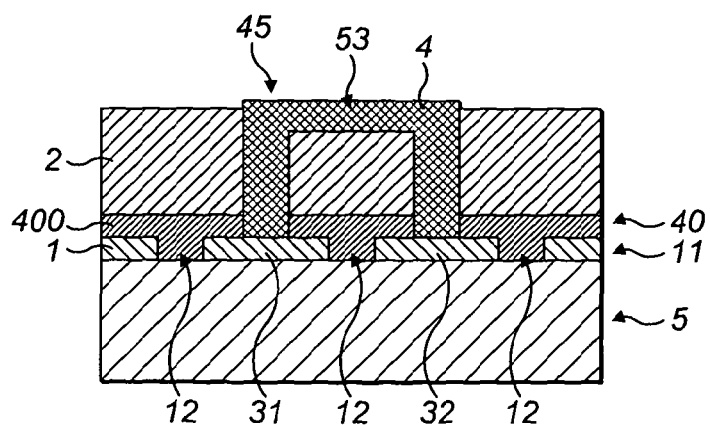
FIG. 5 illustrates a method of electroplating the electrically conductive material within the depressed regions.

Referring now to FIG. 5, in this embodiment a layer 11 of active material 1 is provided above a substrate 5, with insulative features 12 defined in the active layer 11 so as to form a section of a substantially planar electronic device. The insulative features within the active material layer 11 have been filled-in with dielectric material 400, on top of a layer of which is a residual imprint resist material 2. In this case a body 53 of conductive material 4 has been grown in a part of the recessed structure using an electroplating method to form electrical connection 45.

Figure 6A:
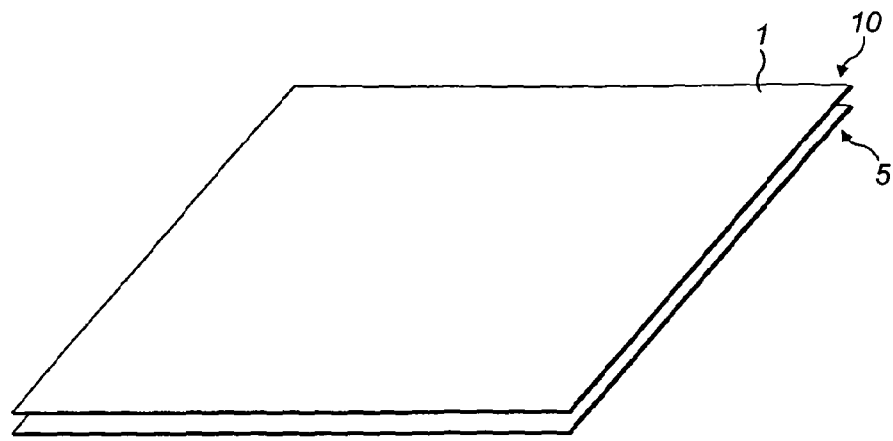
FIGS. 6a-c. illustrate an electrical circuit (SR latch) which has been formed from substantially planar electronic devices and electrically conductive material in a method embodying the invention.
Figure 6B:
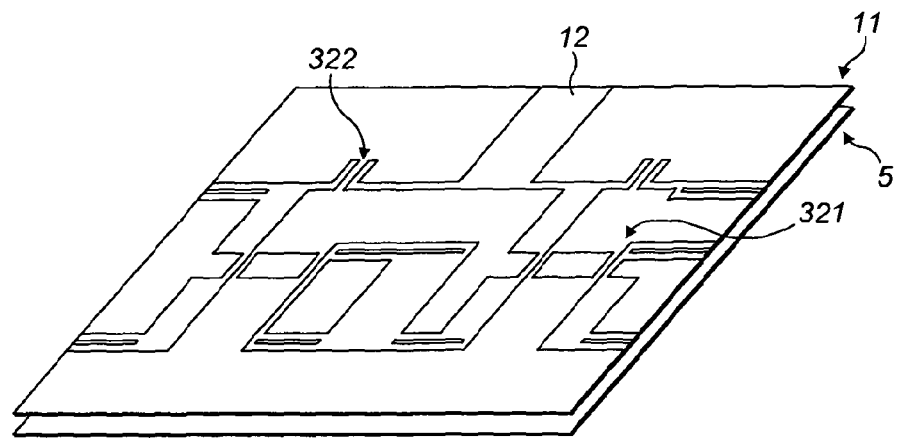
Figure 6C:
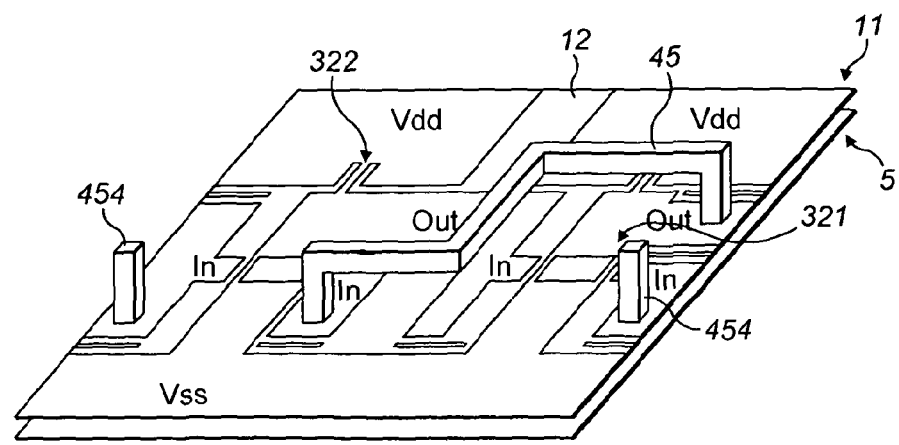

Referring now to FIGS. 6a-6c. FIG. 6a is a schematic of a substrate 5 on which a thin-film 10 of active material 1, in this case semiconductor, has been deposited. FIG. 6b shows a subsequent stage in which a series of insulative features 12 have been produced in the active layer so as to produce a series of substantially planar electronic devices. For example channel 322, defined between a pair of linear insulative features, represents a self-switching diode and channel 321 is the conductive channel of a side-gated transistor. In this instance said electronic devices are two NOR gates in series in which the output of the first NOR gate feeds directly into one input of the second NOR gate using the semiconductor itself as an interconnect (i.e. this connection is provided by active material in the active layer itself). FIG. 6c shows a further stage in which a continuous conductive track 45 has been formed contacting the output of the second NOR gate to one of the inputs of the first NOR gate. The conductive track has been formed from two vertical holes which have been imprinted, etched and then filled with a conductive material by a method embodying the invention. The two holes are connected to each other by a continuous track which is separated from the active material by a dielectric material which is not shown for clarity. Thus the conductive track or out-of-plane interconnection 45 is a bridged interconnection from one substantially planar electronic device to a second substantially planar electronic device. Although the conductive material crosses over a number of insulative features it is separated from these by a layer of dielectric material which shields the substantially planar devices from the effects of the conductive material. Filled holes (which may also be described as via-holes) 454 are also provided for the input. The circuit thus formed is an SR latch (or "flip-flop"). It will be appreciated that similar designs could be employed using NAND gates constructed of substantially planar electronic devices. It will be appreciated that in this and other embodiments, a plurality filled via holes 454 may be formed, each providing a respective electrical connection penetrating the dielectric layer (or layers) to the underlying active material, and then interconnections between these filled via holes may be formed on or over the layer of dielectric material to form further connections as desired between different areas of the active material. As an alternative to connecting filled holes by means of filled trenches, these further connections may, for example, be formed by printing suitable tracks of conductive material over a surface (e.g. an upper surface) of the layer of dielectric material. A further alternative to connecting filled holes by means of filled trenches would be to create these further connections using proximity or contact printing.

Figure 7A:
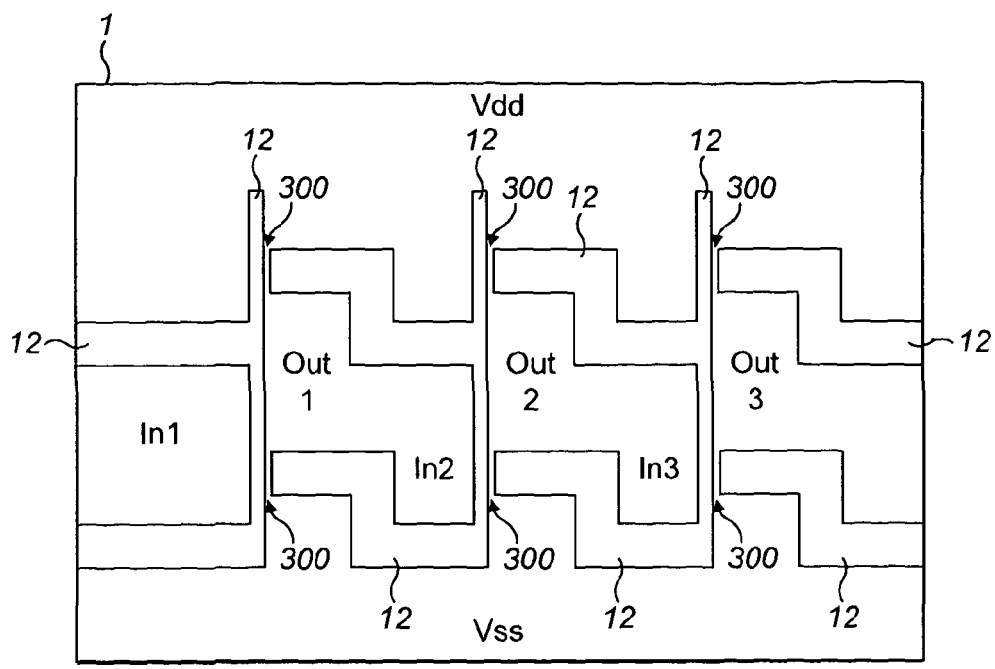
FIGS. 7a-b illustrate a 3-stage ring oscillator which has been formed from substantially planar electronic devices and electrically conductive material in a method embodying the invention.
Figure 7B:
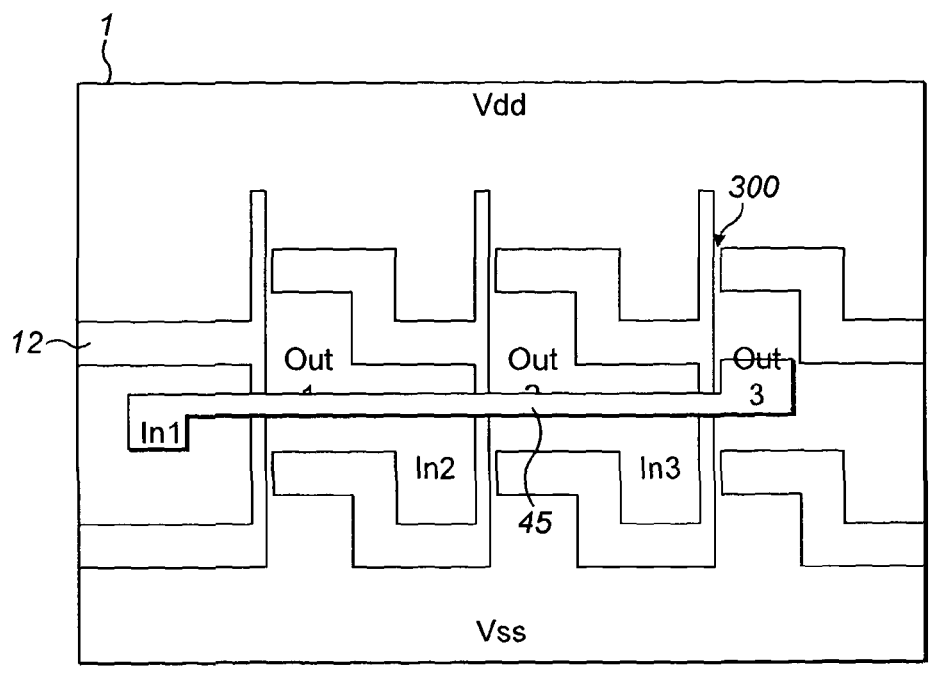
Figure 7B:
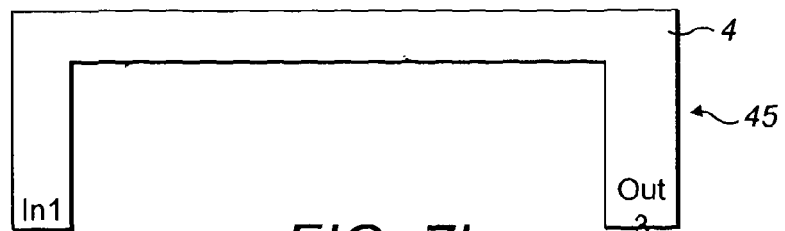

Referring now to FIG. 7a, this shows a 3-stage ring oscillator formed from substantially planar electronic devices in a method embodying the invention. Active material 1 has been patterned such that there are insulative features 12 defined within the layer of active material 1, resulting in channels 300 forming side-gate transistors (in other words, the insulative features define a plurality of side-gated transistors, each comprising a respective conductive channel with a conductivity determined at least in part by a potential applied to the respective side gate or gates). The three inverters are connected in series with the output of inverter 1 (Out1) connected through the active layer (i.e. via an in-plane connection comprising a portion of the active material1) to the input of inverter 2 (In2) and the output of inverter 2 (Out2) connected through the active layer 1 to the input of inverter 3 (In3). FIG. 7b shows the output of inverter 3 (Out3) connected to the input of inverter 1 (In1) through a bridged interconnect 45 of conductive material 4 in a method embodying the invention. In this case a hole is formed above In1 and Out3 with a higher depression (i.e. of shallower depth) connecting the two holes such that once the holes and higher depression are filled with conductive material 4, only the conductive material 4 within the holes is in direct contact with the active layer. It will be appreciated that In1 may itself be connected to other substantially planar electronic devices either through the active layer itself or through a conductive material. In1 and/or Out3 may also or alternatively be connected to a power source or external contact.

Figure 8C:
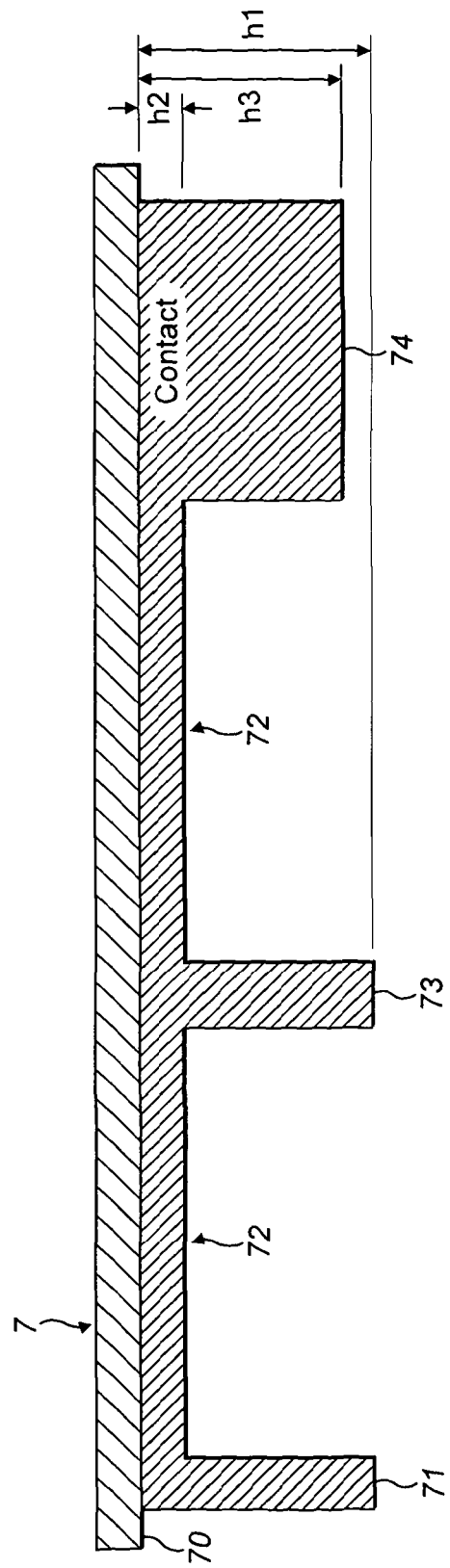

Referring now to FIG. 8a this shows a layer of active material 1 with insulative features 12 defining a 3-stage ring oscillator as described in FIG. 7a formed from substantially planar electronic devices in a method embodying the invention. One of the insulative features 312 is elongated across the active layer so as to completely isolate the right-hand side. Referring now to FIG. 8b this shows the formation of a body of conductive material 4 providing an electrical connection 45 connecting the output of the third-stage of the ring oscillator back to the input of the first stage of the ring oscillator, similar to FIG. 7b, However in this case the conductive material extends beyond and over the elongated insulative feature 312 to a larger contact 645. FIG. 8c shows a side-view of template 7 which may be used to create the body of conductive material providing the integrated interconnection 45 and contact pad 645 in a method embodying the invention. The template comprises a plurality of imprint features 71, 72, 73, 74 having a plurality of respective heights above a base surface 70. Features 71 and 73 have the same and greatest height h1, and are used to form the depressions that are developed into holes completely through the dielectric layer to the active layer (to enable contacts to be made to the active layer). Features 72 are raised a smaller height h2 above the base surface, to form the lateral depressions that are developed into lateral tracks for connecting filled holes and the contact pad. Feature 74 has an intermediate height h3, where h1>h3>h2 above the base surface, and forms the depression that is developed into the recess accommodating the larger portion of conductive material that forms the contact pad 645 in the eventual device/circuit.

Figure 9A:
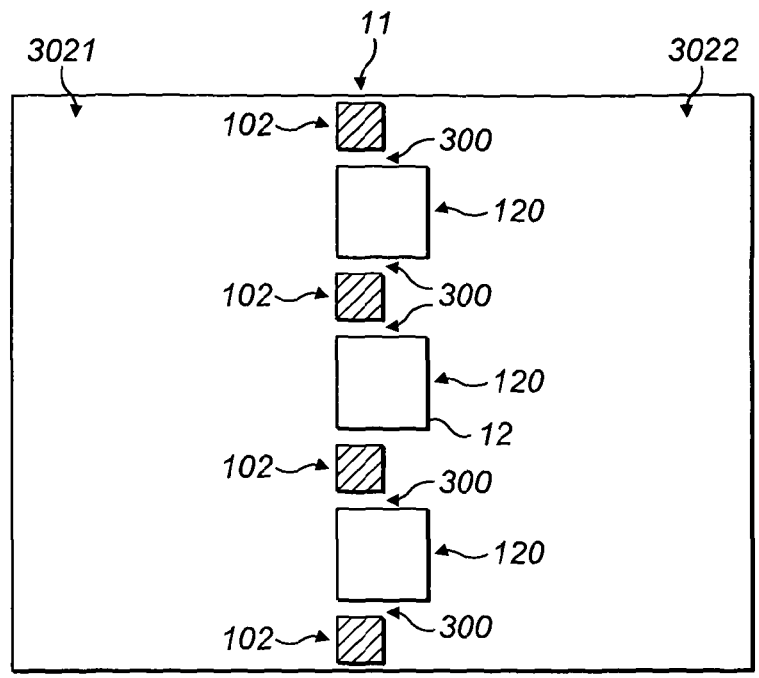
FIGS. 9a-c illustrates a group of 6 substantially planar transistors, which have been arranged in a parallel configuration with an electrically conductive material provided contact to the gate terminal of each device, which have been fabricated in a method embodying the invention.
Figure 9B:
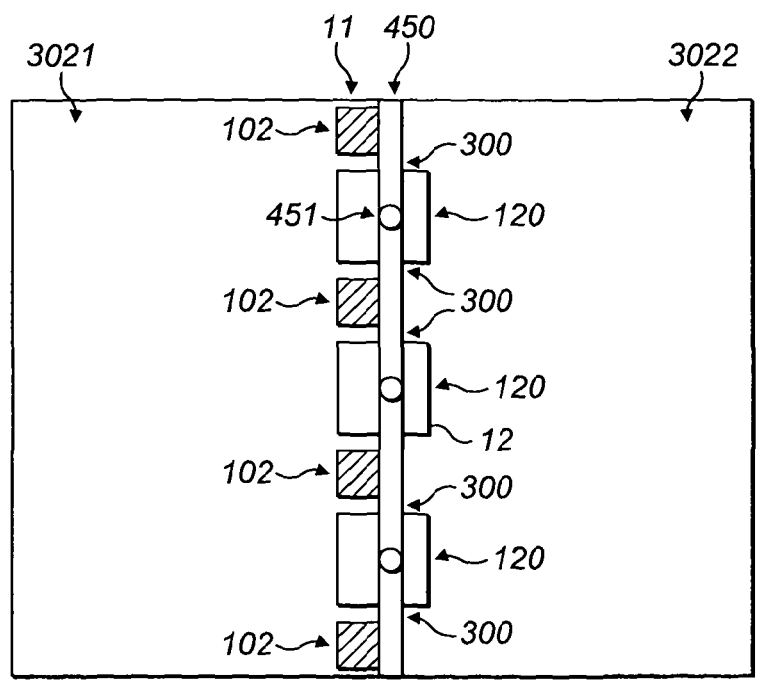
Figure 9C:
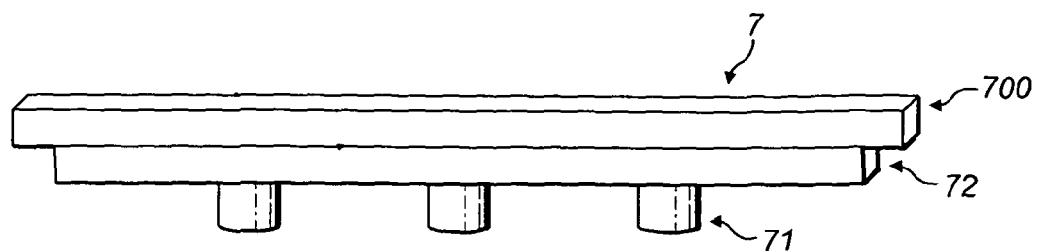

Referring now to FIG. 9a this shows a group of six substantially planar transistors arranged in a parallel configuration with an input area 3021 and output area 3022. The transistors have been created from insulative features 12 defined with an active layer 11 and each transistor is separated from a neighbouring transistor by an insulating feature. There are two types of insulative feature shown between neighbouring transistors. One type 102 has the same width as the transistor channel length and is not connected to a gate electrode. This may be a continuous insulative feature or an insulative feature such as described in PCT/GB2009/050963 by this applicant. The second type of insulative feature 120 located between the transistor channels 300 has a substantially greater width than the transistor channel length. This feature has an insulative trench around its perimeter such as described in WO 02/086973 A2, WO 2006/008467 A1, and WO 2006/120414 A2, This insulative feature functions as a gate terminal for one or two substantially planar transistors. FIG. 9b shows the array of substantially parallel transistors described in FIG. 9a but with a conductive material 450 provided crossing over the gate terminals. The conductive material is a continuous trench substantially parallel to, but at a higher level than, the active material, with holes 451 filled with conductive material which contacts directly onto the active material. Thus the conductive material provides a conductive pathway enabling all of the gate terminals to be controlled simultaneously from one source. FIG. 9c shows a template 7 which may be used to pattern a structure which can be filled in with conductive material to provide the layout described in FIG. 9b in a method embodying the invention. The template has a highest level 700 which could for example be a nickel shim with two levels of protrusions 71 and 72. The higher protrusions 71 provide the deepest imprints or depressions and may be used to define the holes 451, or the depressions developed into the holes, in FIG. 9b. The lower protrusion or protrusions 72 may be used to provide a shallower depression or depressions and may be used to define the continuous trench 450, or the depression that is developed into the continuous trench, in FIG. 9b which connects the filled holes 451 together. After processing the depressions formed by protrusions 71 and 72, with further development as necessary, would be filled-in with conductive material such that the holes corresponding to protrusions 71 would be in contact with the active layer, with the filled-in trench corresponding to protrusion 72 providing a continuous conduction pathway.

For example 50 nm of zinc oxide may be deposited onto a silicon wafer (with 300 nm oxide coating) using rf sputtering. 300 nm of PMMA (Chestech, mr-PMMA 35 k MW) may be spin-coated on top of the zinc oxide and then hard-baked at 150° C. for 5 minutes (hot-plate). A nickel shim (100 μm thickness, 150 nm feature-height), produced by galvanoplastics from a silicon master, may be embossed into the PMMA at 150° C. (hold-time: 5 mins) under vacuum using an EVG520HE thermal-embosser, cooled to 90° C., vented to nitrogen and then de-embossed at 70° C. Residual layer of PMMA (180 nm) may be removed using oxygen plasma (50 W, 50 mTorr, 50 sccm) for 90 seconds (2 nm/min) so as to expose the top surface of zinc oxide within the embossed trenches. The exposed zinc oxide may be etched using reactive ion-etching (150 W, 75 mTorr, 50 sccm $H_2$:10 sccm $CH_4$) for 11 minutes (etch-rate 5 nm/min). Residual PMMA which has not been previously embossed may be completely removed using warm anisole and oxygen plasma (50 W, 100 mTorr, 50 sccm), before alumina (5 nm) is deposited by sputter-coating. 1200 nm of PMMA (Chestech, mr-PMMA 35 k MW) may be deposited by spin-coating and hard-baked at 150° C. for 5 minutes hot-plate). A nickel shim (100 μm thickness, 1000 nm feature-height), produced by galvanoplastics from a silicon master, may be embossed into the PMMA at 150° C. (hold-time: 5 mins) under vacuum using an EVG520HE thermal-embosser, cooled to 90° C., vented to nitrogen and then de-embossed at 70° C. Residual layer of PMMA may be removed using oxygen plasma (50 W, 50 mTorr, 50 sccm) for 120 seconds (2 nm/min). The $Al_2O_3$ acts as an etch-stop but may be removed by reactive ion-etch ($CH_4/H_2$/Ar) to provide a hole with an opening directly above the active layer of zinc oxide. Aluminium (250 nm) may be sputtered into the hole to provide direct contact with the zinc oxide active layer.

Figure 10A:
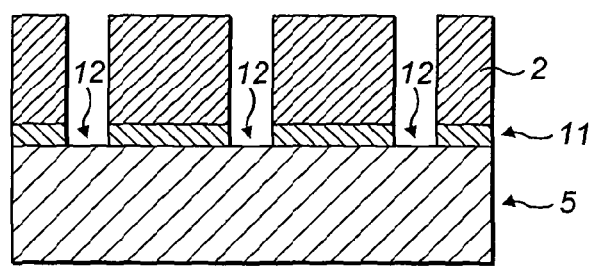
FIGS. 10a-10i show steps in a method of fabricating a structure comprising at least one planar electronic device in a method embodying the invention.
Figure 10B:
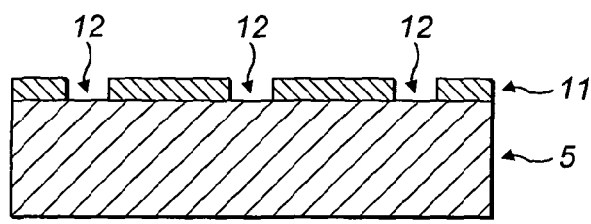
Figure 10C:
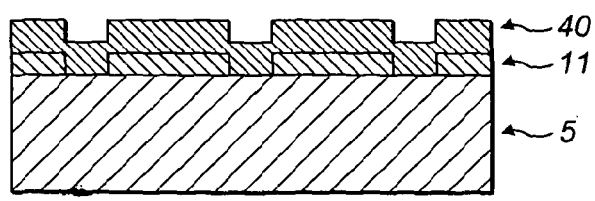
Figure 10D:
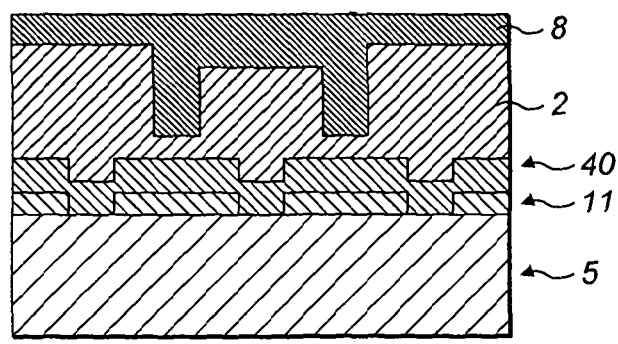
Figure 10E:
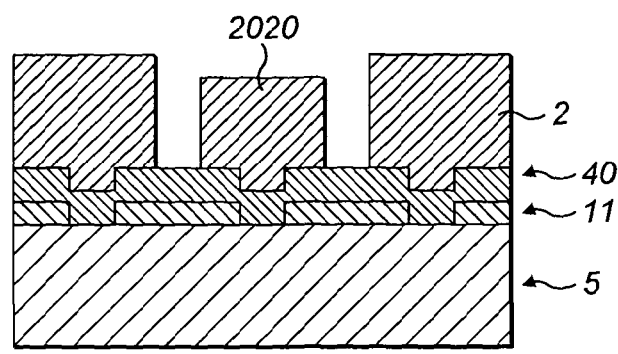
Figure 10F:
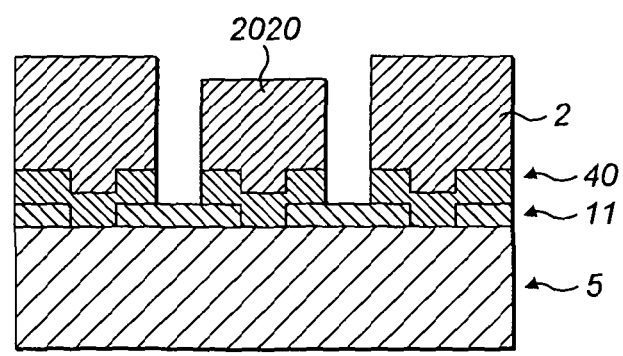
Figure 10G:
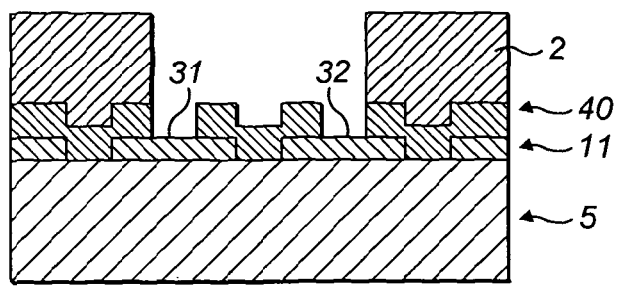
Figure 10H:
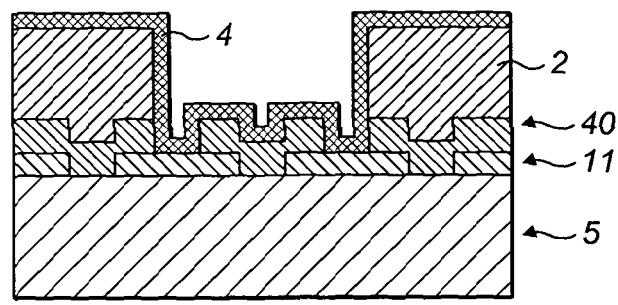
Figure 10I:
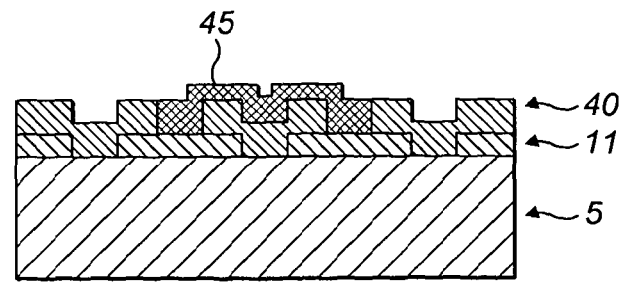

Referring now to FIG. 10a, this shows a structure incorporating a planar electronic device which has been patterned as described for FIGS. 1a-1c. A plurality of insulative features 12 have been formed so as to interrupt the layer of active material, so as to provide a patterned active layer 11 in which one or more planar devices is defined. FIG. 10b shows the next stage after which residual protective dielectric layer 2 has been fully removed, for instance by a plasma (oxygen) or solvent or dry-etch, or a combination of such treatments. FIG. 10*c* illustrates a subsequent stage in which a layer of dielectric material 40 has been deposited onto the active layer 11, to form a conformal coating, for instance by sputter-coating of an insulating metal oxide such as alumina. FIG. 10*d* illustrates a second imprint step whereby a further imprint tool 8 is aligned to the first imprinted pattern (i.e. the substantially planar electronic device so as to align with target contact areas 31, 32 on the patterned active layer 11). In this example the dielectric material 2 is applied before the imprint tool is urged down and the additional dielectric material fills in the patterned area of the dielectric material 40. FIG. 10*e* shows the next stage after which the imprint tool 8 has been removed, leaving a multi-level imprint pattern, including region 2020 which is a portion of the layer of dielectric material 2 at a lower height than the remainder of dielectric material 2. FIG. 10*f* shows a further stage following an etch, or other removal, of exposed dielectric material 40 to expose regions of active material 1. FIG. 10*g* illustrates a further stage in which lower region 2020 of dielectric material 2 has been completely removed, such as by dry-etch or plasma treatment (oxygen), and remaining dielectric material 2 has been concomitantly reduced in height. FIG. 10*h* illustrates a further step in which a conductive material 4 has been deposited to provide a conformal coating over the patterned structure. FIG. 10*i* shows a final step in which the remaining areas of dielectric material 2 have been completely removed, e.g. by solvent or ultrasonic techniques, or a combination of such techniques, and conductive material 4 bonded/adhered to dielectric material 2 has also been removed. In other words, to go from the structure illustrated in FIG. 10*h* to that in FIG. 10*i*, remaining dielectric material 2 has been removed or lifted off, so as to remove conductive material 4 where it is not required. This technique provides a convenient way of removing excess conductive material without requiring planarization or additional masking and etching steps. This method provides the advantage that, in the coating step of FIG. 10*h*, one can deposit conductive material (e.g. metal) everywhere, i.e. over the entire structure of FIG. 10*g*, and then can easily remove conductive material from places where it is not required. In certain embodiments, to produce the structure of FIG. 10*h*, one can use a vacuum deposition technique to deposit metal. Subsequent lift-off of dielectric material 2 provides an easy way of removing excess metal after the vacuum deposition technique.

Figure 11A:
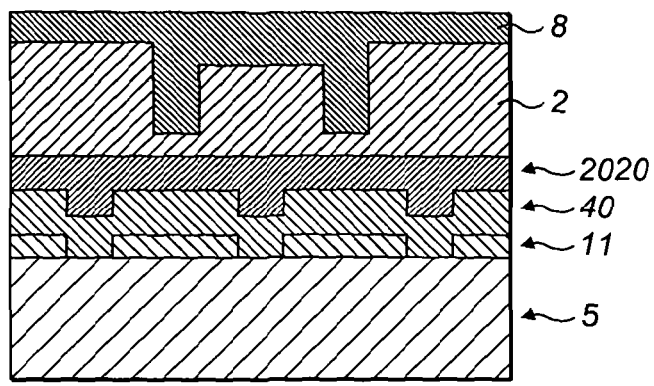
FIGS. 11a-11e show steps in another method of fabricating a structure comprising at least one planar electronic device in a method embodying the invention.
Figure 11B:
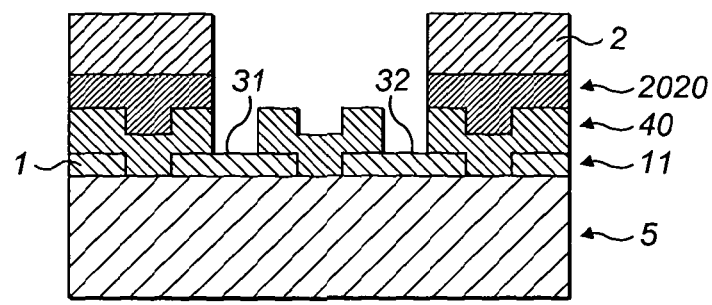
Figure 11C:
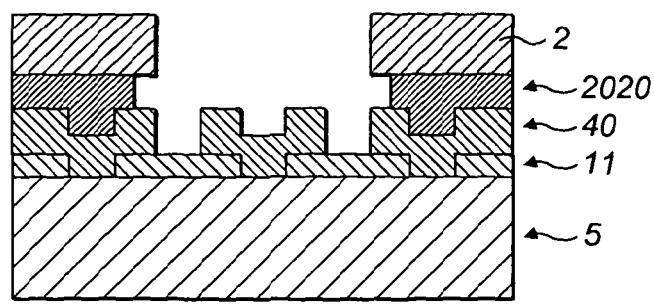
Figure 11D:
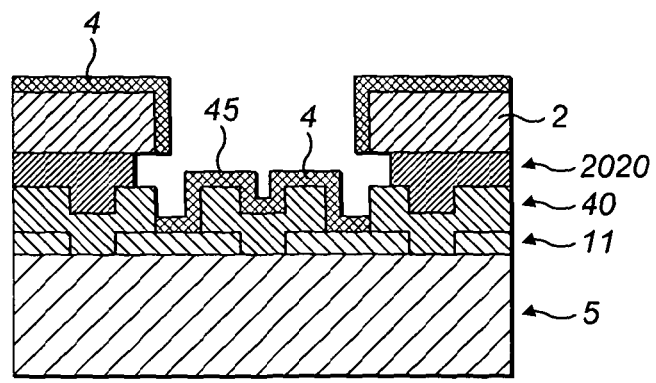
Figure 11E:
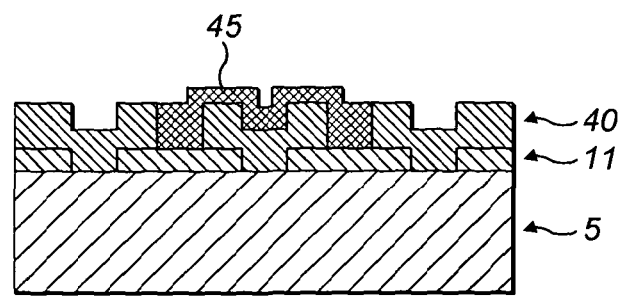

Referring now to FIG. 11*a*, this shows a structure similar to that shown in FIG. 10*d*, but in this instance there is an additional layer 2022 of dielectric material deposited underneath dielectric material 2. Conformal coating layer 40 may thus be referred to as a first layer of dielectric material, patterned upper layer of dielectric material 2 may be referred to as a second layer of dielectric material, and the intermediate layer 2022 may be referred to as a third layer of dielectric material. In certain embodiments layer 2022 is formed from so-called lift-off resist (such as Microchem lift-off resist, LOR). FIG. 11*a* shows an imprint tool 8 urged into the dielectric material 2. To obtain ideal results the glass transition temperature Tg of the dielectric material of layer 2022 should be higher than that of the dielectric material 2. FIG. 11*b* shows a later stage after the imprint tool 8 has been removed, exposed dielectric material 40 has been removed to expose regions of active material 1, and the lowest regions of dielectric material 2 have been removed along with the subsequent exposed regions of dielectric material of layer 2022. The higher regions of dielectric material 2 have been reduced in height by the same amount as the combined height of dielectric material of layer 2022 and lower regions of dielectric material 2. FIG. 11*c* shows a later step during which dielectric material of layer 2022 is isotropically etched, such as by solvent or isotropic plasma techniques, whereas dielectric material 2 is largely unaffected, or at least affected to a lesser extent than dielectric material of layer 2022. This process creates an undercut beneath dielectric material 2 (i.e. undercuts in the holes extending through the layers of dielectric material to exposed portions of the regions of active material 31, 32). FIG. 11*d* illustrates a further stage after a layer of conductive material 4 is deposited over the hole patterned area. The undercut prevents a continuous layer of conductive material from forming. FIG. 11*e* shows the final structure after the dielectric material of layer 2022 has been fully removed, e.g. by lift-off using a developer or solvent formulation specific to that dielectric material of layer 2022. The process also removes remaining dielectric material 2, and conductive material 4, which is adhered to dielectric material 2. As mentioned above, the formation of the undercuts facilitates lift-off of dielectric material of the layer 2022, and hence facilitates removal of conductive material where it is not required, to leave just the electrical connection 45 between the first and second regions 31, 32.

The invention claimed is:

1. A method of manufacturing a structure comprising at least one substantially planar electronic device, the method comprising:
    providing a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;
    forming a patterned layer of dielectric material over the layer of active material, the patterned layer of dielectric material having an exposed surface patterned with at least a first depression arranged over said first terminal;
    removing dielectric material at least from a base of said first depression to expose a surface of the first terminal and form a first hole through the dielectric material to the first terminal; and
    filling, at least partly, said first hole with electrically conductive material to form an electrical connection to the first terminal;
    wherein said exposed surface is patterned with a plurality of depressions, said first depression being one of said plurality of depressions.

2. A method in accordance with claim 1, wherein the first depression has a first depth and the plurality of depressions comprises a second depression having a second depth, the second depth being shallower than the first depth, said removing dielectric material further comprises removing dielectric material from a base of the second depression to form a trench having a base separated from the active layer by a thickness of dielectric material, and the method further comprises filling, at least partly, said trench with electrically conductive material.

3. A method in accordance with claim 2, comprising filling, at least partly, the first hole and the trench with electrically conductive material at the same time.

4. A method in accordance with claim 2, wherein the first and second depressions are arranged to meet one another such that said trench extends from said first hole.

5. A method in accordance with claim 2, wherein the plurality of depressions comprises a third depression having substantially said first depth and being arranged over an area of the layer of active material, said removing dielectric material further comprises removing dielectric material from a base of the third depression to expose a surface of the underlying area of active material and form a second hole through the dielectric material to the underlying active material; and the method further comprises filling, at least partly, said second hole with electrically conductive material to form an electrical connection to the underlying active material.

6. A method in accordance with claim 5, wherein the first, second, and third depressions are arranged to meet such that said trench connects the first and second holes.

7. A method in accordance with claim 6, comprising filling, at least partly, the first and second holes and the trench with electrically conductive material so as to form an electrical connection between the first terminal and the area of active material underlying the second hole.

8. A method in accordance claim 5, wherein said area of active material underlying the second hole comprises at least part of a terminal of a second planar electronic device defined in the layer of active material by the plurality of insulative features.

9. A method of manufacturing a structure comprising at least one substantially planar electronic device, the method comprising:
  providing a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;
  forming a patterned layer of dielectric material over the layer of active material, the patterned layer of dielectric material having an exposed surface patterned with at least a first depression arranged over said first terminal;
  removing dielectric material at least from a base of said first depression to expose a surface of the first terminal and form a first hole through the dielectric material to the first terminal; and
  filling, at least partly, said first hole with electrically conductive material to form an electrical connection to the first terminal;
  wherein said forming of the patterned layer of dielectric material comprises using an imprint tool to form the or each said depression.

10. A method of manufacturing a structure comprising at least one substantially planar electronic device, the method comprising:
  providing a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;
  forming a patterned layer of dielectric material over the layer of active material, the patterned layer of dielectric material having an exposed surface patterned with at least a first depression arranged over said first terminal;
  removing dielectric material at least from a base of said first depression to expose a surface of the first terminal and form a first hole through the dielectric material to the first terminal; and
  filling, at least partly, said first hole with electrically conductive material to form an electrical connection to the first terminal;
  wherein said insulative features are insulative trenches formed in the layer of active material, and the step of forming the patterned layer of dielectric material comprises filling the insulative trenches with the dielectric material.

11. A method of manufacturing a structure comprising at least one substantially planar electronic device, the method comprising:
  providing a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;
  forming a patterned layer of dielectric material over the layer of active material, the patterned layer of dielectric material having an exposed surface patterned with at least a first depression arranged over said first terminal;
  removing dielectric material at least from a base of said first depression to expose a surface of the first terminal and form a first hole through the dielectric material to the first terminal; and
  filling, at least partly, said first hole with electrically conductive material to form an electrical connection to the first terminal;
  wherein said step of providing comprises using a first imprint tool to form the plurality of insulative features in the layer of active material.

12. A method in accordance with claim 11, wherein the step of providing comprises providing an unpatterned layer of said active material, using said first imprint tool to form a patterned layer of insulative material over the unpatterned layer, the patterned layer of insulative material having a surface patterned by the first imprint tool with a plurality of recesses, each recess corresponding to a respective insulative feature, and etching to develop each recess into an insulative trench interrupting the layer of active material.

13. A method in accordance with claim 11, wherein the step of forming the patterned layer of dielectric material comprises using a second imprint tool to form the or each said depression.

14. A method of manufacturing a structure comprising at least one substantially planar electronic device, the method comprising:
  providing a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;
  forming a patterned layer of dielectric material over the layer of active material, the patterned layer of dielectric material having an exposed surface patterned with at least a first depression arranged over said first terminal;

removing dielectric material at least from a base of said first depression to expose a surface of the first terminal and form a first hole through the dielectric material to the first terminal; and filling, at least partly, said first hole with electrically conductive material to form an electrical connection to the first terminal;

arranging the plurality of insulative features to define a plurality of planar electronic devices in the layer of active material and to define a first plurality of electrical connections between said devices in the layer of active material.

15. A method in accordance with claim 14, further comprising forming a plurality of said holes and said trenches at least partly filled with electrically conductive material to form a second plurality of electrical connections between said devices outside the layer of active material.

16. A method of manufacturing a structure comprising at least one substantially planar electronic device, the method comprising:

providing a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;

forming a patterned layer of dielectric material over the layer of active material, the patterned layer of dielectric material having an exposed surface patterned with at least a first depression arranged over said first terminal;

removing dielectric material at least from a base of said first depression to expose a surface of the first terminal and form a first hole through the dielectric material to the first terminal; and filling, at least partly, said first hole with electrically conductive material to form an electrical connection to the first terminal;

forming a plurality of said holes, each extending through the dielectric material to a respective area of active material, at least partly filling each hole with electrically conductive material to form an electrical connection through the dielectric material to the respective area of active material, and forming a third plurality of electrical connections between the at least partly filled holes over the layer of dielectric material.

17. A method in accordance with claim 16, wherein forming said third plurality of electrical connections over the layer of dielectric material comprises printing.

18. A method of manufacturing a structure comprising at least one substantially planar electronic device, the method comprising:

providing a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;

forming a patterned layer of dielectric material over the layer of active material, the patterned layer of dielectric material having an exposed surface patterned with at least a first depression arranged over said first terminal;

removing dielectric material at least from a base of said first depression to expose a surface of the first terminal and form a first hole through the dielectric material to the first terminal; and filling, at least partly, said first hole with electrically conductive material to form an electrical connection to the first terminal;

wherein said exposed surface is patterned with a further depression arranged over a further area of active material, said removing step further comprises removing dielectric material from a base of said further depression to expose a surface of the further area and form a further hole through the dielectric material to the further area; and said filling further comprises filling, at least partly, said further hole with electrically conductive material to form a further electrical connection through the dielectric material to the further area.

19. A method in accordance with claim 18, further comprising forming an electrical connection over the dielectric material and extending between the at least partly filled first and further holes so as to electrically connect the first terminal and the further area of active material.

20. A method in accordance with claim 19, wherein forming said electrical connection over the dielectric material comprises forming a track of electrically conductive material by printing.

21. A method of manufacturing a structure comprising at least one substantially planar electronic device, the method comprising:

providing a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;

forming a patterned layer of dielectric material over the layer of active material, the patterned layer of dielectric material having an exposed surface patterned with at least a first depression arranged over said first terminal;

removing dielectric material at least from a base of said first depression to expose a surface of the first terminal and form a first hole through the dielectric material to the first terminal; and filling, at least partly, said first hole with electrically conductive material to form an electrical connection to the first terminal;

wherein said insulative features define a plurality of planar electronic devices, the first device being one of these devices, and each device being selected from a list comprising: a diode; a transistor; a self-switching device; a side-gated transistor; and a logic gate.

22. A method of manufacturing a structure comprising at least one substantially planar electronic device, the method comprising:

providing a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;

forming a patterned layer of dielectric material over the layer of active material, the patterned layer of dielectric material having an exposed surface patterned with at least a first depression arranged over said first terminal;

removing dielectric material at least from a base of said first depression to expose a surface of the first terminal and form a first hole through the dielectric material to the first terminal; and filling, at least partly, said first hole with electrically conductive material to form an electrical connection to the first terminal;

forming at least one intermediate layer of dielectric material over the layer of active material, and wherein said patterned layer of dielectric material is formed over said at least one intermediate layer, such that said patterned layer is not directly in contact with said active material.

23. A method in accordance with claim 22, wherein forming at least one intermediate layer comprises forming a single intermediate layer of dielectric material.

24. A method in accordance with claim 22, wherein forming at least one intermediate layer comprises forming a first intermediate layer in direct contact with the active material, and a second intermediate layer over the first intermediate layer.

25. A method in accordance with claim 24, further comprising forming an undercut in the second intermediate layer inside said first hole, before said filling.

26. A method in accordance with claim 25, wherein said filling comprises forming a coating of electrically conductive material inside the first hole and over dielectric material adjacent the first hole, said undercut providing an interruption in said coating.

27. A method in accordance with claim 26, further comprising removing dielectric material of said second intermediate layer so as to remove conductive material coating dielectric material adjacent the first hole.

28. A method of forming an electrical connection between a first portion of a layer of active material and a second portion of said layer, the method comprising:

forming a first layer of dielectric material over the first and second portion;

forming a patterned second layer of dielectric material over the first layer, the patterned second layer having an exposed surface patterned with a first depression arranged over the first portion, a second depression arranged over the second portion, and a third depression connecting the first and second depressions;

removing dielectric material at least from the bases of the first, second, and third depressions to form a first hole through the layers of dielectric material to expose a surface of the first portion, to form a second hole through the layers of dielectric material to expose a surface of the second portion, and to leave at least a portion of the first layer between (separating) the first and second holes;

forming a coating of electrically conductive material inside the first and second holes, over said portion of the first layer, and over portions of the second layer adjacent the first and second holes so as to form said electrical connection.

29. A method in accordance with claim 28, further comprising removing dielectric material of said second layer so as to remove electrically conductive material not inside the first and second holes or covering said portion of the first layer.

30. A method in accordance with claim 28, further comprising:

forming a third layer of dielectric material between the first layer and the second layer; and forming undercuts in said third layer inside the first and second holes before forming said coating.

31. A structure comprising:

a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;

a layer of dielectric material formed over the layer of active material; and a first hole in the layer of dielectric material, extending through the dielectric material to the first terminal, and being filled, at least partly, with electrically conductive material to form an electrical connection through the dielectric material to the first terminal;

a further hole in the layer of dielectric material, the further hole extending through the dielectric material to a further area of the layer of active material, and being filled, at least partly, with electrically conductive material to form a further electrical connection through the dielectric material to the further area;

a conductive track extending in a plane substantially parallel to the layer of active material and arranged to connect the at least partly filled first and further holes to provide an electrical connection between the first terminal and said further area;

wherein said conductive track is arranged in a trench in a surface of the layer of dielectric material.

32. A structure in accordance with claim 31, wherein said conductive track is arranged on a surface of the layer of dielectric material.

33. An electrical circuit comprising a structure comprising:

a layer of active material having a plurality of insulative features formed therein, each insulative feature at least partly inhibiting electrical current flow in said layer, and the plurality of insulative features defining at least a first substantially planar electronic device in said layer having at least a respective first terminal and a respective second terminal, each terminal comprising a respective area of the layer of active material;

a layer of dielectric material formed over the layer of active material; and a first hole in the layer of dielectric material, extending through the dielectric material to the first terminal, and being filled, at least partly, with electrically conductive material to form an electrical connection through the dielectric material to the first terminal.

* * * * *